United States Patent [19]

Takai

[11] Patent Number: 5,493,252

[45] Date of Patent: Feb. 20, 1996

[54] FEEDFORWARD DISTORTION COMPENSATION CIRCUIT

[75] Inventor: Ken-ichi Takai, Tokyo, Japan

[73] Assignee: NEC Corporation, Tokyo, Japan

[21] Appl. No.: 345,685

[22] Filed: Nov. 21, 1994

[30] Foreign Application Priority Data

Nov. 24, 1993 [JP] Japan .................................. 5-315818

[51] Int. Cl.$^6$ ...................................................... H03F 1/32
[52] U.S. Cl. ............................................. 330/52; 330/151
[58] Field of Search .............................. 330/52, 149, 151

[56] References Cited

U.S. PATENT DOCUMENTS 5,155,448  10/1992  Powell ................................. 330/52 X

FOREIGN PATENT DOCUMENTS 4-70203   3/1989  Japan .
1-198809  8/1989  Japan .
4-83406   3/1992  Japan .

Primary Examiner—James B. Mullins
Attorney, Agent, or Firm—Sughrue, Mion, Zinn, Macpeak & Seas

[57] ABSTRACT

A feedforward distortion compensation circuit includes a main amplification path, an auxiliary amplification path, first and second transmission paths, a signal attenuation path, a first signal injector, a first signal distributor, a second signal injector, a first signal synthesizer, a first phase difference detector, a first level detector, a second phase difference detector, a second signal synthesizer, a second level detector, and a control circuit. The control circuit controls a first variable attenuator and a first variable phase shifter such that a detection level of the first level detector becomes minimum, and first pilot signals synthesized by the first signal synthesizer on the basis of a phase difference detected by the first phase difference detector respectively have opposite phases, and controls a second variable attenuator and a second variable phase shifter such that a detection level of the second level detector becomes minimum, and second pilot signals synthesized by the second signal synthesizer on the basis of a phase difference detected by the second phase difference detector respectively have opposite phases.

19 Claims, 16 Drawing Sheets

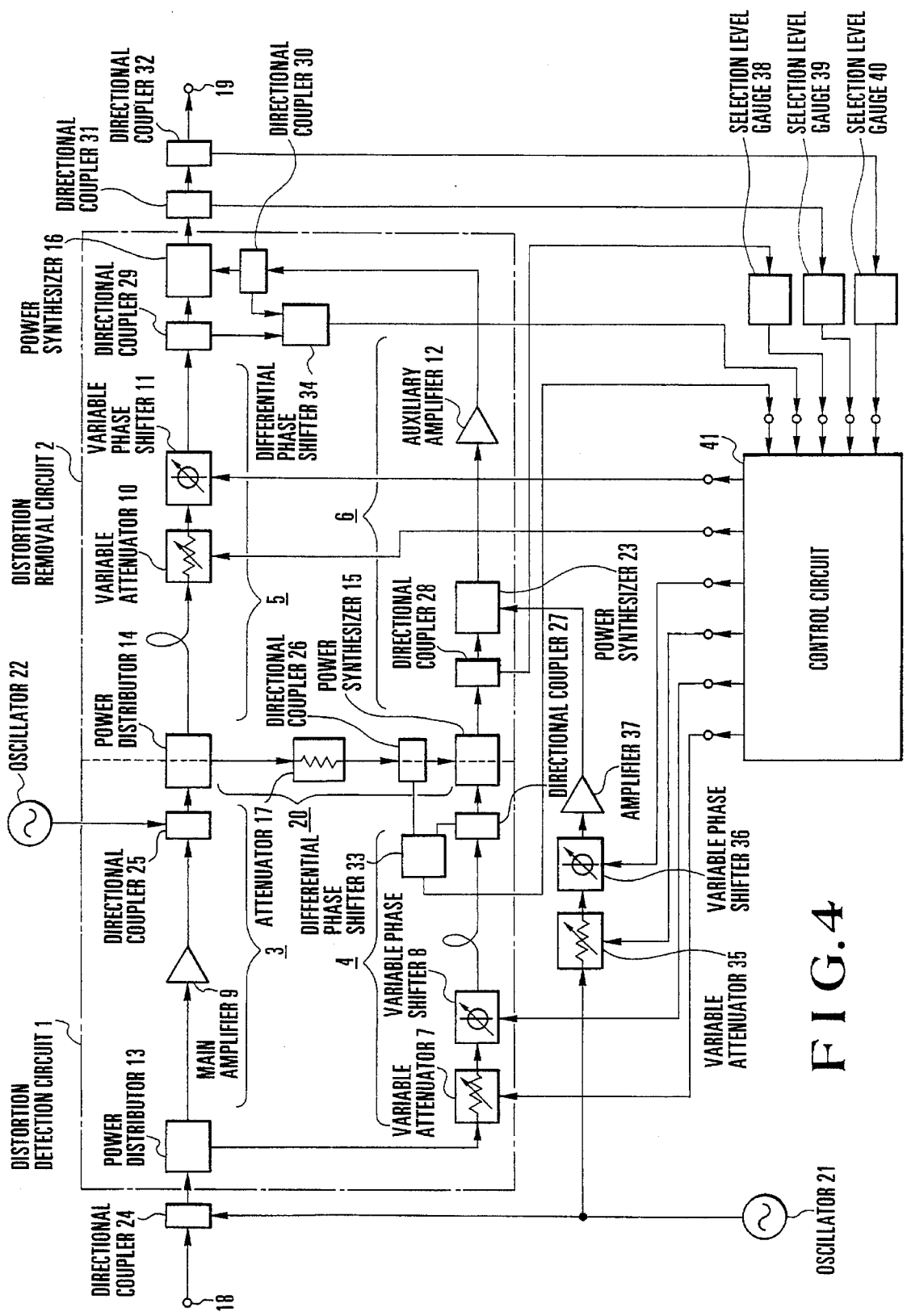
F I G. 4

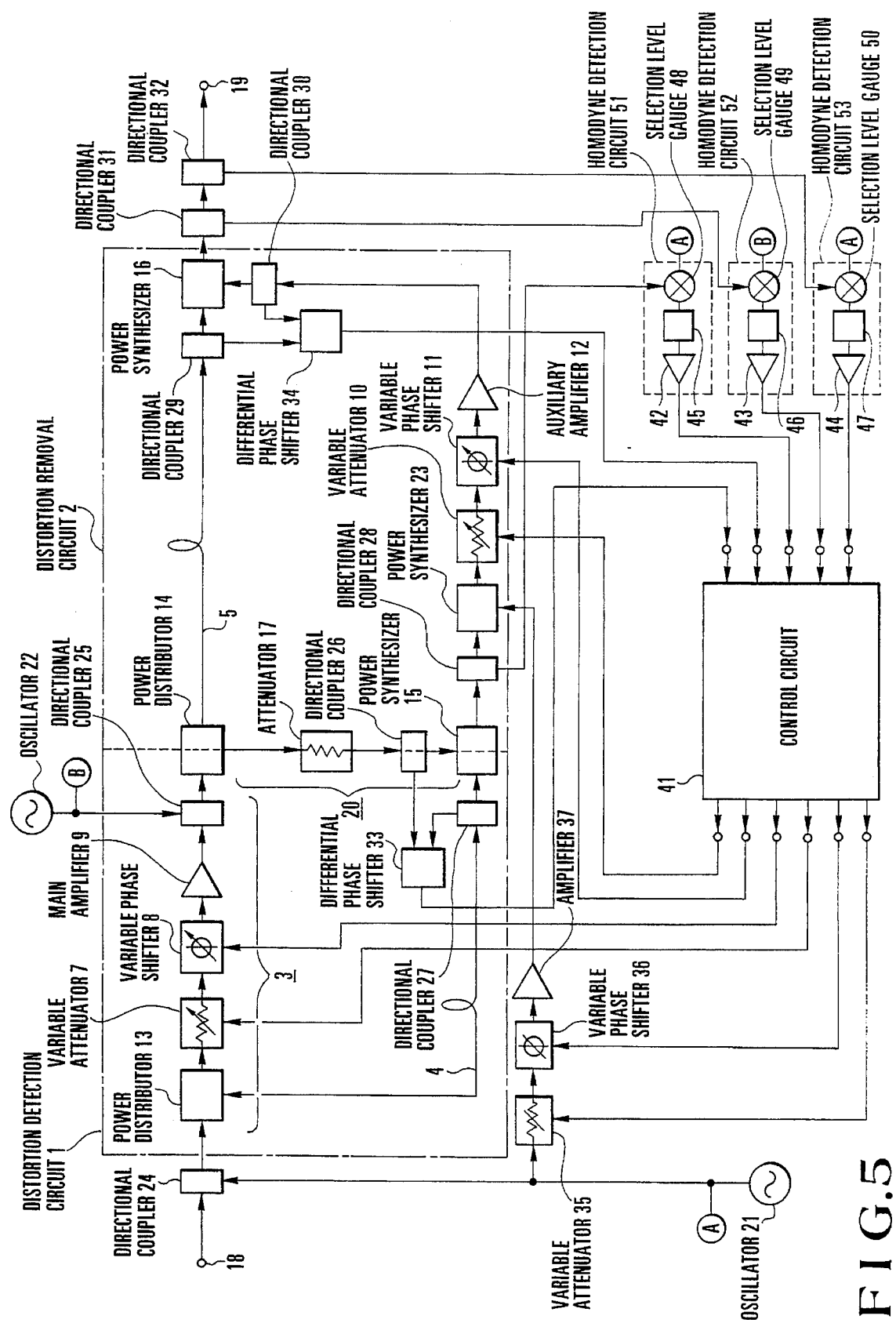
F I G. 5

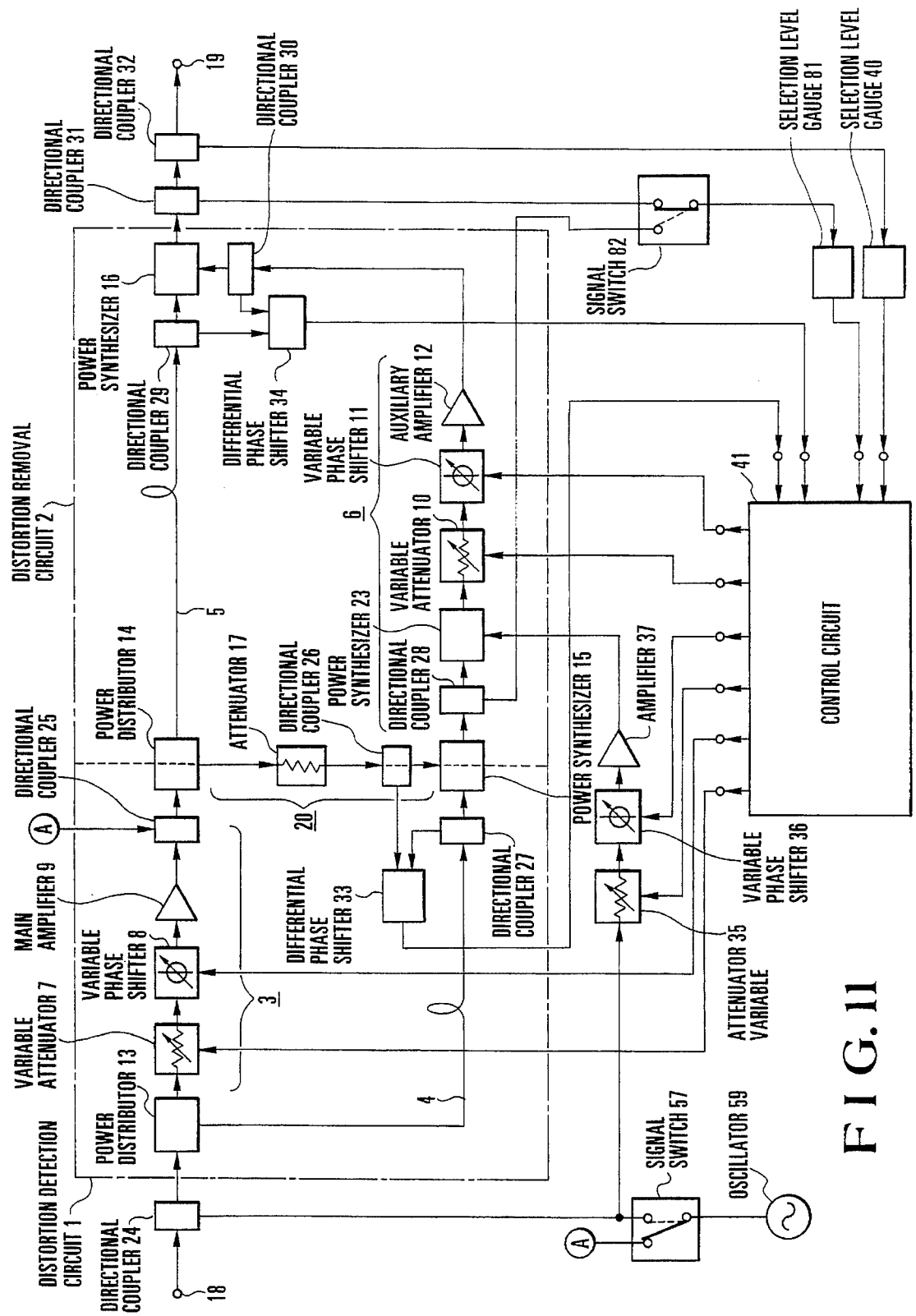
F I G. 11

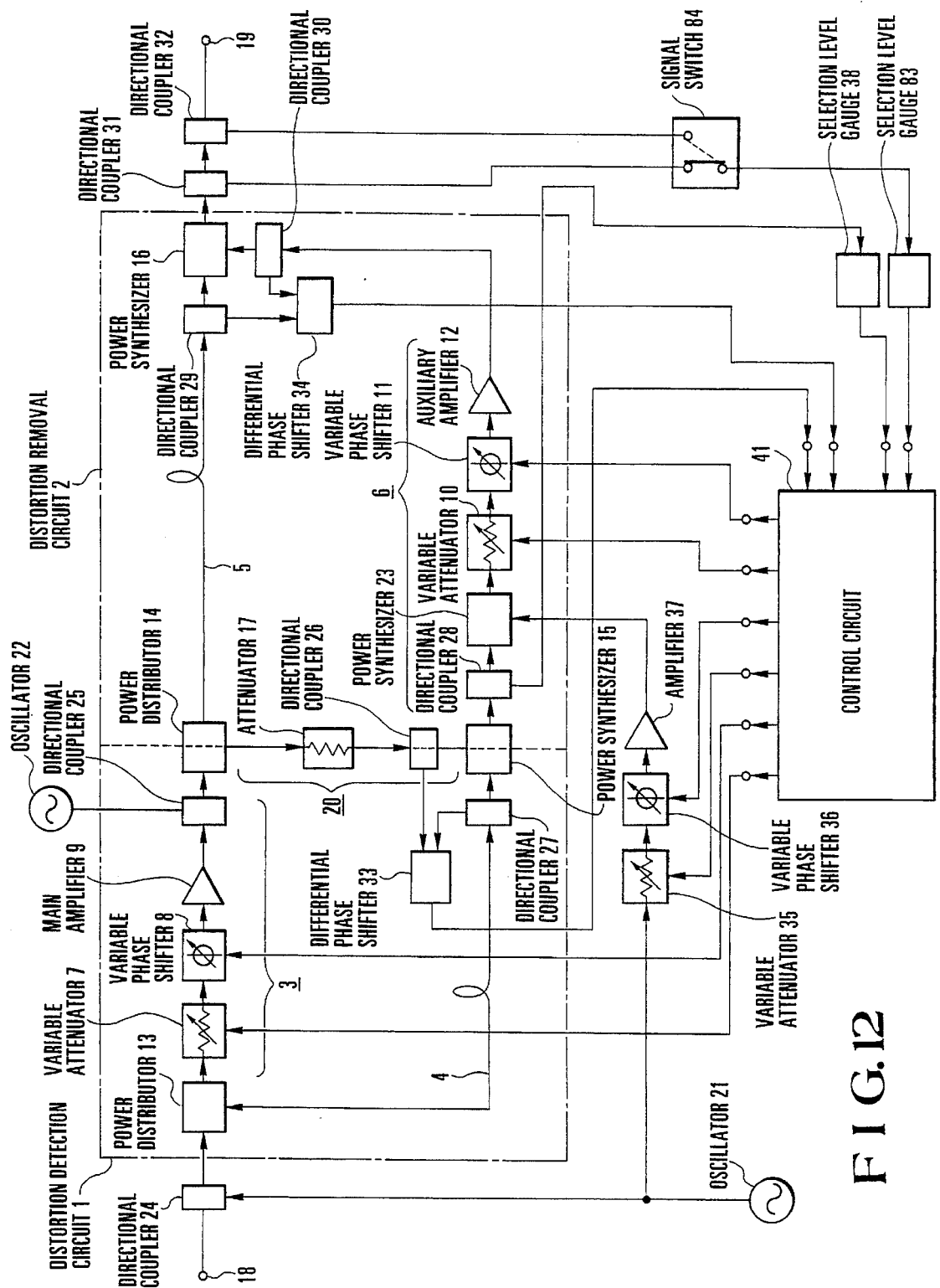
F I G. 12

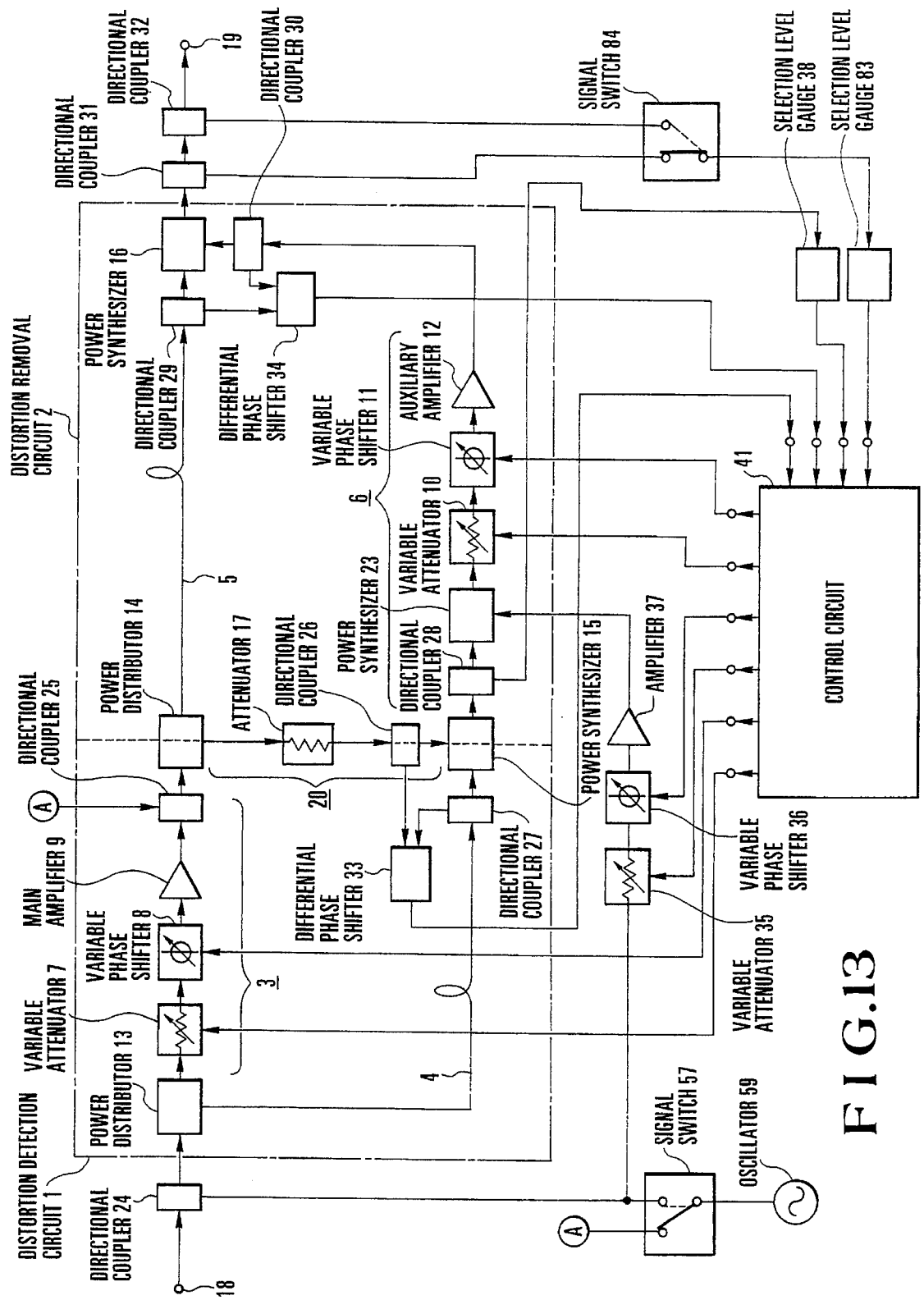
F I G. 13

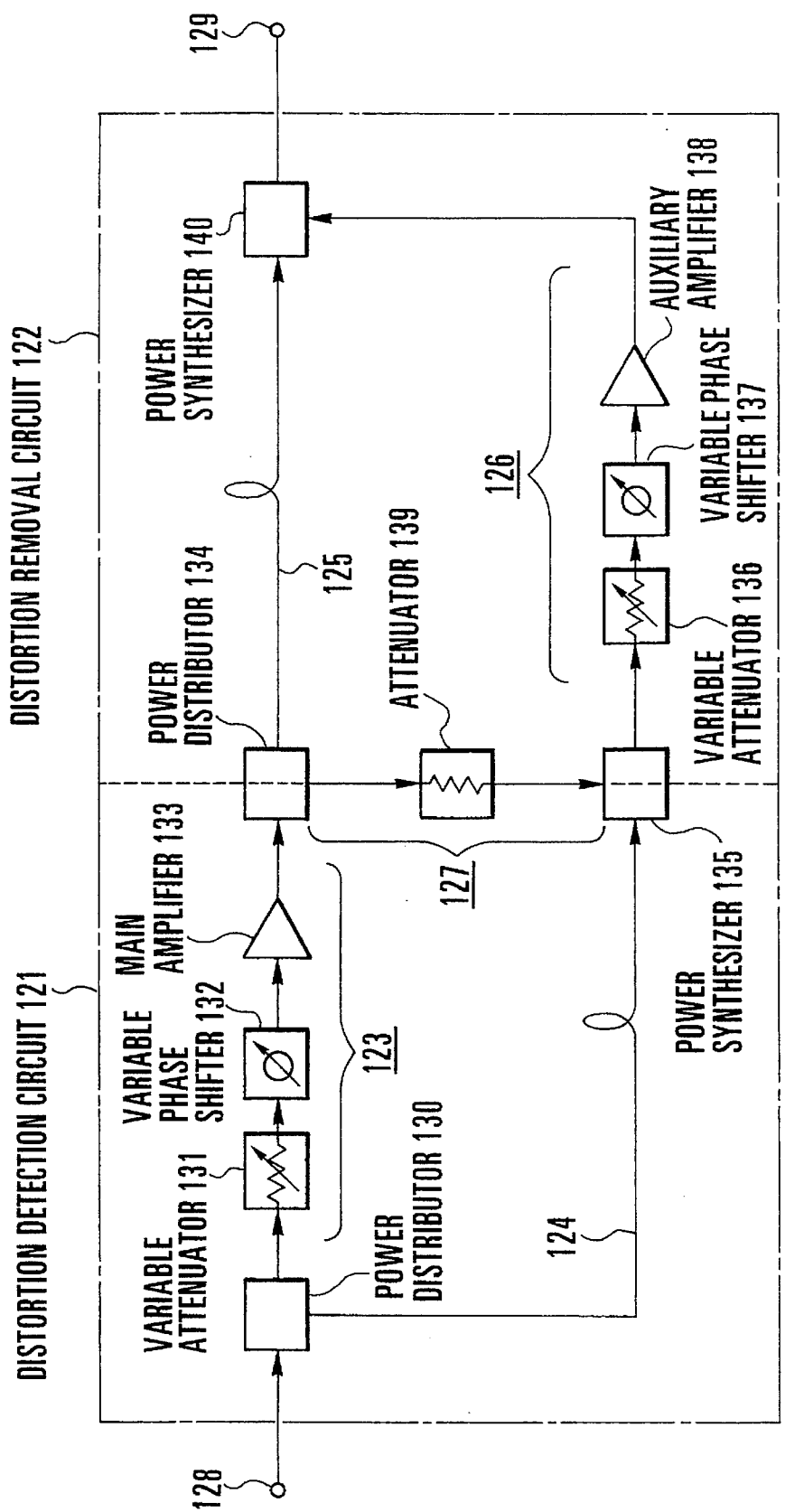

FEEDFORWARD DISTORTION COMPENSATION CIRCUIT

BACKGROUND OF THE INVENTION

The present invention relates to a feedforward distortion compensation circuit and, more particularly, to a feedforward distortion compensation circuit, for a linear amplifier, used in a high-frequency range.

For example, as described in Japanese Patent Laid-Open Nos. 1-198809 (Reference 1), 4-70203 (Reference 2), and 4-83406 (Reference 3), a conventional feedforward distortion compensation circuit of this type is used to realize a high-output linear amplifier used in a high-frequency range and to save power consumption.

FIG. 16 shows a basic arrangement of a conventional feedforward distortion compensation circuit.

A feedforward distortion compensation circuit is basically constituted by two signal canceling circuits. One of them is a distortion detection circuit 121, and the other is a distortion removal circuit 122. The distortion detection circuit 121 is constituted by a main amplifier path 123, a delay-line path 124, and a signal attenuation path 127. The distortion removal circuit 122 is constituted by a delay-line path 125, the signal attenuation path 127, and an auxiliary amplifier path 126. The main amplifier path 123 of the distortion detection circuit 121 is constituted by connecting a variable attenuator 131, a variable phase shifter 132, and a main amplifier 133 in series with each other, and the delay-line path 124 is constituted by a transmission line. The delay-line path 125 of the distortion removal circuit 122 is constituted by a transmission line, and the auxiliary amplifier path 126 is constituted by connecting a variable attenuator 136, a variable phase shifter 137, and an auxiliary amplifier 138 in series with each other. Reference numeral 128 denotes an input terminal to which an input signal is supplied, and reference numeral 129 denotes an output terminal from which an output signal is transmitted.

In this case, since characteristics do not considerably change, the delay-line path 124 may comprise one or both of the variable attenuator 131 and the variable phase shifter 132. Similarly, the delay-line path 125 may comprise one or both of the variable attenuator 136 and the variable phase shifter 137. The main amplifier path 123 of the distortion detection circuit 121 is connected to the delay-line path 125 of the distortion removal circuit 122 through a power distributer 134, and the delay-line path 124 of the distortion detection circuit 121 is connected to the auxiliary amplifier path 126 through a power synthesizer 135. An attenuator 139 is connected to the signal attenuation path 127 between the power distributer 134 and the power synthesizer 135 as needed. Reference numeral 130 denotes a power distributer for distributing an input signal input from the input terminal 128 to the main amplifier path 123 and the delay-line path 124, and reference numeral 140 denotes a power synthesizer for synthesizing a signal from the delay-line path 125 with a signal from the auxiliary amplifier path 126 to output the synthesized signal to the output terminal 129.

The operation of the above feedforward distortion compensation circuit will be described below.

An input signal supplied to the input terminal 128 is distributed to the main amplifier path 123 and the delay-line path 124 by the power distributer 130. A distorted signal component passing through the main amplifier path 123 is distributed to the delay-line path 125 and the signal attenuation path 127 by the power distributer 134. The distorted signal component passing through the signal attenuation path 127 is synthesized with a signal component passing through the delay-line path 124 in the power synthesizer 135, and the synthesized signal is output to the auxiliary amplifier path 126. At this time, the variable attenuator 131 and the variable phase shifter 132 are adjusted such that both the signal components passing through two paths input to the power synthesizer 135, i.e., the delay-line path 124 and the signal attenuation path 127 are equal to each other in amplitude and delay amount and respectively have opposite phases. In this case, the conditions for the opposite phases are realized by properly setting a phase shift amount between the input and output terminals of each of the power distributers 130 and 134 and the power synthesizer 135 or by using phase inversion in the main amplifier 133. Otherwise, as shown in FIG. 17 showing a phase inversion circuit using a circulator, when a phase inversion circuit in which one terminal of a circulator 141 is short-circuited and terminated by a terminator 142 is connected to the main amplifier path 123, the delay-line path 124, or the signal attenuation path 127, the above conditions can be realized.

Since the distortion detection circuit 121 is arranged as described above, a difference component between two signals passing through the delay-line path 124 and the signal attenuation path 127 is output from the power synthesizer 135 to the auxiliary amplifier path 126. More specifically, when the variable attenuator 131 and the variable phase shifter 132 are adjusted as described above, the difference component is constituted by only a nonlinear distortion component generated by the main amplifier 133. For this reason, the circuit 121 is called a distortion detection circuit.

Of signals distributed by the power distributer 134 and passing through the main amplifier path 123, a signal output to the delay-line path 125 is synthesized by the power synthesizer 140 with a signal passing through the auxiliary amplifier path 126. At this time, the variable attenuator 136 and the variable phase shifter 137 are adjusted such that the transfer characteristics of the two paths from the input terminal of the power distributer 134 to the output terminal 129, i.e., the delay-line path 125 and the pair of the signal attenuation path 127 and the auxiliary amplifier path 126, are equal to each other in amplitude and delay amount, and respectively have opposite phases. In this case, since a signal passing through the auxiliary amplifier path 126 is the distortion component of an output signal output from the main amplifier 133 and detected by the distortion detection circuit 121, the power synthesizer 140 synthesizes the output from the main amplifier 133 with the distortion component to respectively have opposite phases and equal amplitudes. As a result, the distortion components of an output from the overall circuit are canceled out.

The above operation is the basic operation of a general feedforward distortion compensation circuit. The distortion compensation performance of the feedforward distortion compensation circuit largely depends on the adjustment accuracy of the variable attenuator 131 and the variable phase shifter 132 in the distortion detection circuit 121 and the adjustment accuracy of the variable attenuator 136 and the variable phase shifter 137 in the distortion removal circuit 122. However, the above adjustment cannot easily performed such that a balanced state which satisfies the above conditions is kept. Even if perfect adjustment is performed by an initial control operation, the characteristics of the main amplifier 133 change due to a change in environmental temperature, a small change in power supply voltage, a change in input power, deterioration over time, or the like. For this reason, the transfer characteristics of the distortion detection circuit 121 and the distortion removal circuit 122 cannot be easily followed.

Therefore, for example, in the prior art described in Reference 3, as a means for accurately detecting the transfer characteristics, the following means is used. That is, a first pilot signal is input to the input terminal of the distortion compensation circuit at a specific frequency, and a second pilot signal is input to the main amplification path at a specific frequency. A residual first pilot signal level in the distortion detection circuit is detected in the auxiliary amplifier path, and a residual second pilot signal level in the distortion removal circuit is detected by an output from the distortion compensation circuit. The variable attenuator and variable phase shifter of the main amplifier path and the variable attenuator and variable phase shifter of the auxiliary amplifier path are adjusted such that the detection levels of these signals become minimum.

In a conventional feedforward distortion compensation circuit, a variable attenuator and a variable phase shifter are adjusted on the basis of only the detected residual pilot signal levels. However, since the residual pilot signal levels detected in this case do not directly represent the adjustment amounts of the variable attenuator and the variable phase shifter, control of the variable attenuator and the variable phase shifter inevitably depends on only an estimative algorithm. For this reason, not only an excessive load acts on a control circuit but also a large number of steps are required to cause the adjustment amounts to reach optimal adjustment amounts. For this reason, an abrupt change in characteristics or a small change in characteristics cannot be easily followed.

SUMMARY OF THE INVENTION

It is an object of the present invention to provide a feedforward distortion compensation circuit capable of reducing the load of a control circuit.

It is another object of the present invention to provide a feedforward distortion compensation circuit whose adjustment accuracy is improved.

In order to achieve the above objects, according to the present invention, there is provided a feedforward distortion compensation circuit comprising a main amplification path including main amplifying means for amplifying a signal, first variable attenuating means for adjusting an attenuation amount, and first variable phase shifting means for adjusting a phase shift amount, an auxiliary amplification path including auxiliary amplifying means for amplifying a signal, second variable attenuating means for adjusting an attenuation amount, and second variable phase shifting means for adjusting a phase shift amount, first and second transmission paths for transmitting signals, a signal attenuation path for attenuating a signal by predetermined attenuation, first signal injecting means for injecting a first pilot signal having a specific frequency into an input signal from an input terminal, first signal distributing means for distributing the input signal, into which the first pilot signal is injected, to the main amplification path and the first transmission path, second signal injecting means for injecting a second pilot signal having a specific frequency into the main amplification path, second signal distributing means for distributing an output signal from the main amplification path to the second transmission path and the signal attenuation path, first signal synthesizing means for synthesizing an output signal from the first transmission path with an output signal from the signal attenuation path to output a synthesized signal to the auxiliary amplification path, first phase difference detecting means for detecting a phase difference between the first pilot signal passing through the main amplification path and the first pilot signal passing through the first transmission path, first level detecting means for detecting a level of the first pilot signal passing through the auxiliary amplification path, second phase difference detecting means for detecting a phase difference between the second pilot signal passing through the auxiliary amplification path and the second pilot signal passing through the second transmission path, second signal synthesizing means for synthesizing an output signal from the auxiliary amplification path with an output signal from the second transmission path to output a synthesized signal to an output terminal, second level detecting means for detecting a level of the second pilot signal included in an output signal from the second signal synthesizing means, and control means for controlling the first variable attenuating means and the first variable phase shifting means such that a detection level of the first level detecting means becomes minimum, and the first pilot signals synthesized by the first signal synthesizing means on the basis of the phase difference detected by the first phase difference detecting means respectively have opposite phases, and controlling the second variable attenuating means and the second variable phase shifting means such that a detection level of the second level detecting means becomes minimum, and the second pilot signals synthesized by the second signal synthesizing means on the basis of the phase difference detected by the second phase difference detecting means respectively have opposite phases.

BRIEF DESCRIPTION OF THE DRAWINGS

FIG. 4 is a block diagram showing a modification of the embodiment in FIG. 3;

FIG. 5 is a block diagram showing a feedforward distortion compensation circuit according to the fourth embodiment of the present invention;

FIG. 11 is a block diagram showing a feedforward distortion compensation circuit according to the 10th embodiment of the present invention;

FIG. 12 is a block diagram showing a feedforward distortion compensation circuit according to the 11th embodiment of the present invention;

FIG. 13 is a circuit diagram showing a feedforward distortion compensation circuit according to the 12th embodiment of the present invention;

FIG. 16 is a block diagram showing a conventional feedforward distortion compensation circuit.

DESCRIPTION OF THE PREFERRED EMBODIMENTS

The present invention will be described below with reference to the accompanying drawings.

Figure 1:
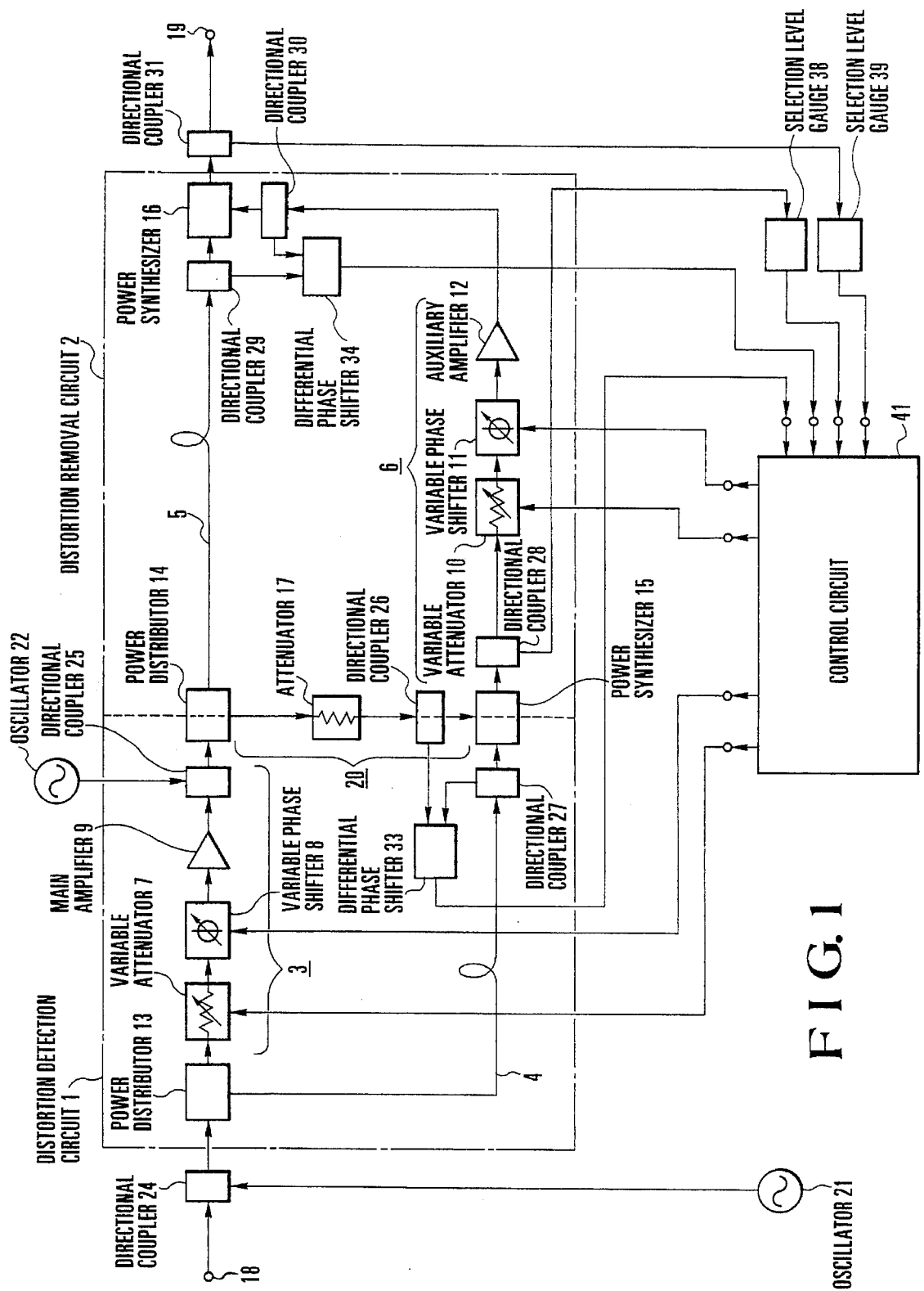
FIG. 1 is a block diagram showing a feedforward distortion compensation circuit according to the first embodiment of the present invention.

FIG. 1 shows a feedforward distortion compensation circuit according to the first embodiment of the present invention. Referring to FIG. 1, reference numeral 1 denotes a distortion detection circuit for detecting the nonlinear distortion component of a main amplifier 9, and reference numeral 2 denotes a distortion removal circuit in which the distortion component detected by the distortion detection circuit 1 is amplified by an auxiliary amplifier 12 and then synthesized with an output from the main amplifier 9 again to cause the nonlinear distortion component generated by the main amplifier 9 to cancel out, thereby removing the nonlinear distortion component.

The distortion detection circuit 1 is constituted by a main amplifier path 3, a delay-line path 4, and a signal attenuation path 20, and the distortion removal circuit 2 is constituted by a delay-line path 5, an auxiliary amplifier path 6, and the signal attenuation path 20. The main amplifier path 3 of the distortion detection circuit 1 is constituted by connecting a variable attenuator 7, a variable phase shifter 8, a main amplifier 9, and a directional coupler 25 in series with each other, and the delay-line path 4 is constituted by a transmission path including a directional coupler 27. The delay-line path 5 of the distortion removal circuit 2 is constituted by a transmission path including a directional coupler 29, and the auxiliary amplifier path 6 is constituted by connecting a directional coupler 28, a variable attenuator 10, a variable phase shifter 11, and an auxiliary amplifier 12 in series with each other. The variable attenuators 7 and 10 and the variable phase shifters 8 and 11 are used to make the attenuation and phase shift amounts of an input signal variable, and the attenuation and phase shift amounts can be electrically controlled by a control circuit 41 (to be described later).

Reference numeral 13 denotes a power distributer for distributing an input signal input to an input terminal 18 to the main amplifier path 3 and the delay-line path 4; 14, a power distributer for distributing an output signal from the main amplifier path 3 to the delay-line path 5 and the signal attenuation path 20; 15, a power synthesizer for synthesizing an output signal from the delay-line path 4 with an output signal from the signal attenuation path 20 to output the synthesized signal to the auxiliary amplifier path 6; 16, a power synthesizer for synthesizing an output signal from the delay-line path 5 with an output signal from the auxiliary amplifier path 6 to output the synthesized signal to an output terminal 19; and 17, an attenuator connected to the signal attenuation path 20 between the power distributer 14 and the power synthesizer 15.

Reference numeral 21 denotes an oscillator for oscillating a first pilot signal having a specific frequency. The first pilot signal output from the oscillator 21 is injected into an input signal from the input terminal 18 through a directional coupler 24 connected to the input stage of the distortion detection circuit 1. Reference numeral 22 denotes an oscillator for oscillating a second pilot signal having a specific frequency different from that of the first pilot signal. The second pilot signal output from the oscillator 22 is injected into an output signal from the main amplifier 9 through a directional coupler 25 connected to the output stage of the main amplifier path 3. Reference numerals 26, 30, and 31 denote directional couplers. The directional coupler 26 is connected between the attenuator 17 and the power synthesizer 15, the directional coupler 30 is connected between the auxiliary amplifier 12 and the power synthesizer 16, and the directional coupler 31 is connected between the power synthesizer 16 and the output terminal 19.

Reference numeral 33 denotes a phase difference detection circuit for detecting the phase difference between first pilot signals which are respectively extracted from the outputs from the directional couplers 26 and 27 and respectively pass through the main amplifier path 3 and the delay-line path 4. Reference numeral 34 denotes a phase difference detection circuit for detecting the phase difference between second pilot signals which are respectively extracted from the outputs from the directional couplers 29 and 30 and respectively pass through the auxiliary amplifier path 6 and the delay-line path 5. Reference numeral 38 denotes a selection level gauge for detecting the level of the first pilot signal passing through the auxiliary amplifier path 6, and reference numeral 39 denotes a selection level gauge for detecting the level of a second pilot signal included in an output from the distortion removal circuit 2 on the basis of an output from the directional coupler 31.

Reference numeral 41 denotes a control circuit for controlling the variable attenuator 7 and the variable phase shifter 8 such that the detection level of the selection level gauge 38 is minimum, and a phase difference detected by the phase difference detection circuit 33 becomes 180°, or first pilot signals synthesized by the power synthesizer 15 on the basis of the detected phase difference respectively have opposite phases. At the same time, the control circuit 41 controls the variable attenuators 10 and the variable phase shifter 11 such that a detection level of the selection level gauge 39 is minimum, and a detection phase difference detected by the phase difference detection circuit 34 becomes 180°, or second pilot signals synthesized by the power synthesizer 16 on the basis of the detected phase difference respectively have opposite phases.

The operation of the embodiment shown in FIG. 1 will be described below.

An input signal supplied to the input terminal 18 is input to the distortion detection circuit 1 through the directional coupler 24, and the power distributer 13 distributes the input signal to the main amplifier path 3 and the delay-line path 4. The signal distributed to the main amplifier path 3 is amplified by the main amplifier 9 through the variable attenuator 7 and the variable phase shifter 8, thereby obtaining an amplified signal having a distortion. The amplified signal from the main amplifier 9 is distributed to the delay-line path 5 and the signal attenuation path 20 by the power distributer 14 through the directional coupler 25. The amplified signal distributed to the signal attenuation path 20 is attenuated by the attenuator 17. The attenuated signal passes through the directional coupler 26, and then is synthesized by the power synthesizer 15 with a signal passing through the delay-line path 4 and the directional coupler 27. At this time, when the signal components of both the delay-line path 5 and the signal attenuation path 20 are equal to each other in amplitude and delay amount and respectively have opposite phases, only a distortion component generated by the main amplifier 9 is output from the power synthesizer 15. That is, the distortion detection circuit 1 detects the distortion component generated by the main amplifier 9.

Since a first pilot signal supplied from the oscillator 21 to the input terminal of the distortion detection circuit 1 through the directional coupler 24 passes through the path through which an input signal from the input terminal 18 passes, the phase difference detection circuit 33 extracts the first pilot signals which are respectively output from the output terminals of the directional couplers 26 and 27 through the main amplifier 9 and the delay-line path 4 and detects the phase difference between the first pilot signals on both the paths. On the other hand, the selection level gauge 38 detects the level of the first pilot signal left in the distortion detection circuit 1 on the basis of an output from the directional coupler 28. The control circuit 41 electrically adjusts the attenuation amount of the variable attenuator 7 and the phase shift amount of the variable phase shifter 8 such that the phase difference detected by the phase difference detection circuit 33 becomes 180°, or the first pilot signals synthesized by the power synthesizer 15 on the basis of the detected phase difference respectively have opposite phases, and, at the same time, a detection level detected by the selection level gauge 38 becomes minimum.

A distortion component detected by the distortion detection circuit 1 is amplified by the auxiliary amplifier 12 through the auxiliary amplifier path 6 including the variable attenuator 10 and the variable phase shifter 11. A distortion component amplified by the auxiliary amplifier 12 passes through the directional coupler 30, and is synthesized by the power synthesizer 16 with an amplified signal having distortion and passing through the delay-line path 5. In this case, when the transfer characteristics of the two paths between the input terminal of the power distributer 14 and the output terminal 19, i.e., the delay-line path 5 and the pair of the signal attenuation path 20 and the auxiliary amplifier path 6 are equal to each other in amplitude and delay amount, and respectively have opposite phases, only an amplified signal from which the distortion component generated by the main amplifier 9 is removed appears at the output terminal 19. In this case, a second pilot signal injected from the oscillator 22 into the main amplifier path 3 through the directional coupler 25 is distributed to the delay-line path 5 and the signal attenuation path 20 by the power distributer 14. The second pilot signal distributed by the power distributer 14 and passing through the signal attenuation path 20 is input to the auxiliary amplifier path 6 through the power synthesizer 15. The second pilot signals distributed to the delay-line path 5 and the pair of the signal attenuation path 20 and the auxiliary amplifier path 6 are synthesized with each other by the power synthesizer 16 again similar to the signal input to the input terminal 18. The phase difference detection circuit 34 extracts the second pilot signals respectively output from the directional couplers 29 and 30 through the delay-line path 5 and the auxiliary amplifier path 6 to detect the phase difference between the second pilot signals. At the same time, the selection level gauge 39 detects the level of a second pilot signal left in the distortion removal circuit 2 on the basis of an output from the directional coupler 31.

The control circuit 41 electrically adjusts the attenuation amount of the variable attenuator 10 and the phase shift amount of the variable phase shifter 11 such that the phase difference detected by the phase difference detection circuit 34 is set to be 180°, or the second pilot signals synthesized by the power synthesizer 16 on the basis of the detected phase difference respectively have opposite phases, and, at the same time, the detection level detected by the selection level gauge 39 becomes minimum. In this manner, only an amplified signal from which a distortion component is removed and which includes a second pilot signal whose level is minimum is output from the output terminal 19.

As described above, according to this embodiment, when two control operations, i.e., the control operation of the variable attenuator 7 and the variable attenuator 10 and the control operation of the variable phase shifter 8 and the variable phase shifter 11 are always or intermittently performed, a feedforward distortion compensation circuit having very high stability can be realized.

Note that, in the above embodiment, although the output terminals of the variable attenuators 7 and 10 are connected to the input terminals of the variable phase shifters 8 and 11, respectively, the input terminals of the variable attenuators 7 and 10 may be connected to the output terminals of the variable phase shifters 8 and 11, respectively. In addition, the directional coupler 25 may be connected to the input terminal of the main amplifier 9 in the main amplifier path 3. Similarly, the directional coupler 28 may be connected to the output terminal of the auxiliary amplifier 12 in the auxiliary amplifier path 6. The signal attenuation path 20 may be constituted by only a transmission path without using the attenuator 17.

Figure 2:
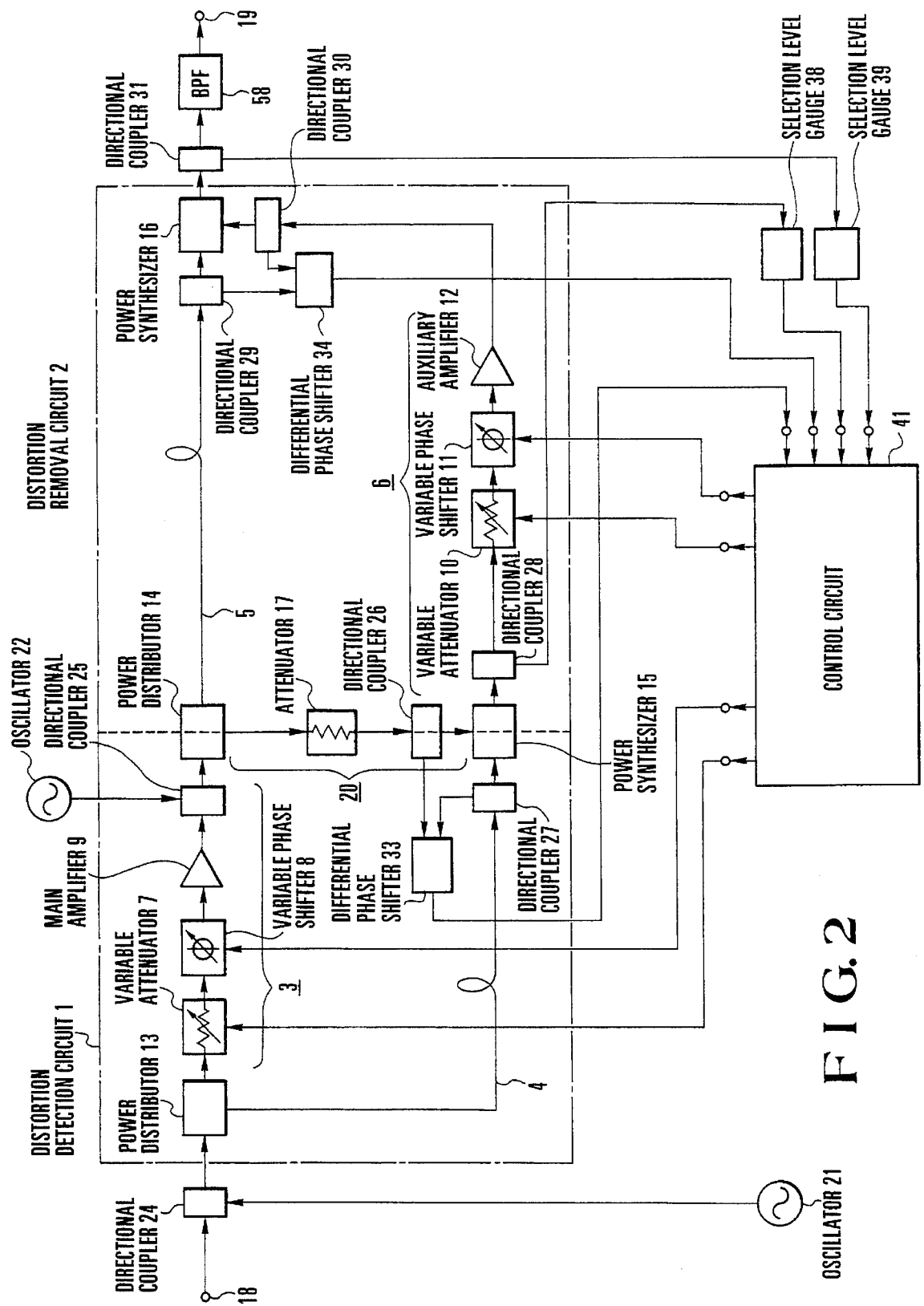
FIG. 2 is a block diagram showing a feedforward distortion compensation circuit according to the second embodiment of the present invention.

FIG. 2 shows the second embodiment of the present invention. The same reference numerals as in FIG. 1 denote the same parts in FIG. 2. Referring to FIG. 2, in addition to the arrangement of the embodiment in FIG. 1, a band-pass filter 58 for removing components except for a signal component from an output signal at an output terminal 19 is connected between a directional coupler 31 and the output terminal 19. According to this embodiment, the band-pass filter 58 removes the component of a first pilot signal from the output signal from the output terminal 19.

Figure 3:
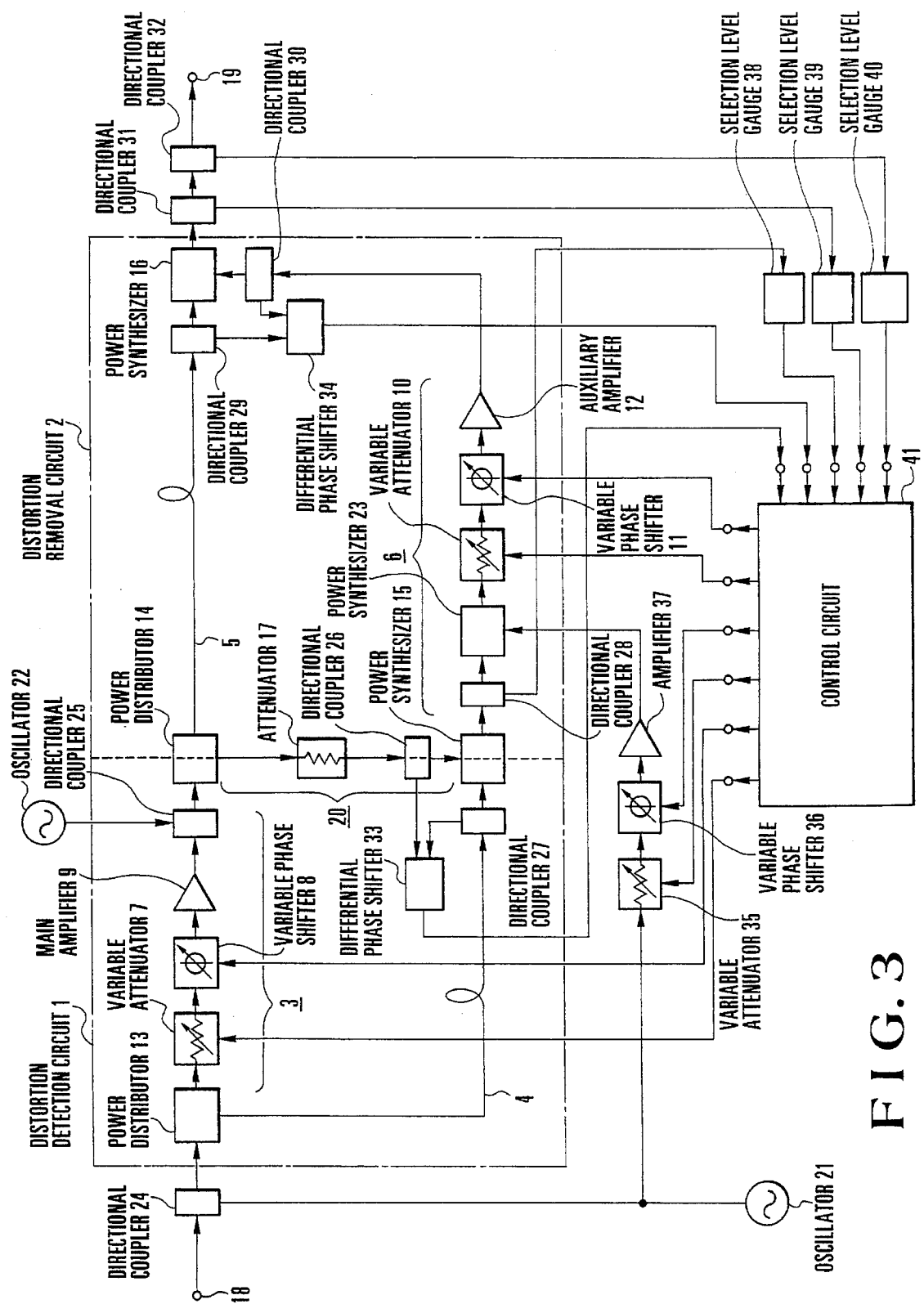
FIG. 3 is a circuit diagram showing a feedforward distortion compensation circuit according to the third embodiment of the present invention.

FIG. 3 shows the third embodiment of the present invention. The same reference numerals as in FIG. 1 denote the same parts in FIG. 3. Referring to FIG. 3, in addition to the arrangement of the embodiment in FIG. 1, a variable attenuator 35 for making the attenuation amount of a first pilot signal from an oscillator 21 variable, a variable phase shifter 36 for making the phase shift amount of an output from the variable attenuator 35 variable, an amplifier 37 for amplifying an output from the variable phase shifter 36, and a power synthesizer 23, connected between a directional coupler 28 and a variable attenuator 10 in an auxiliary amplifier path 6, for synthesizing a distortion component from a distortion detection circuit 1 with a first pilot signal from the amplifier 37 are arranged. In addition, the arrangement of the third embodiment comprises a directional coupler 32 connected between a directional coupler 31 and an output terminal 19 and a selection level gauge 40 for detecting the level of the first pilot signal included in an output signal extracted from the directional coupler 32. A control circuit 41 controls the attenuation amount of the variable attenuator 35 and the phase shift amount of the variable phase shifter 36 such that the level of the first pilot signal detected by the selection level gauge 40 becomes minimum.

In the above arrangement, a first pilot signal oscillated by the oscillator 21 through the variable phase shifter 36 and the amplifier 37 is injected into an auxiliary amplifier path 6 through the power synthesizer 23. The first pilot signal injected into the auxiliary amplifier path 6 is synthesized by a power synthesizer 16 with a first pilot signal passing through a delay-line path 5. In this case, since the transfer characteristics of the delay-line path 5 and the auxiliary amplifier path 6 are adjusted in advance such that the delay-line path 5 and the auxiliary amplifier path 6 are equal to each other in amplitude and respectively have opposite phases, the control circuit 41 adjusts the attenuation amount of the variable attenuator 35 and the phase shift amount of the variable phase shifter 36 such that the detection level of a residual first pilot signal detected by the selection level gauge 40 on the basis of an output from the directional coupler 32 becomes minimum. In this manner, the residual first pilot signal supplied from the distortion detection circuit 1 through the delay-line path 5 is removed.

According to this embodiment, when three control operations, i.e., the control operation of a variable attenuator 7 and the variable attenuator 10, the control operation of a variable phase shifter 8 and a variable phase shifter 11, and the control operation of the variable attenuator 35 and the variable phase shifter 36 are always or intermittently performed, a feedforward distortion compensation circuit which has very high stability and is free from a noise component can be realized.

Note that, although the output terminal of the variable attenuator 35 is connected to the input terminal of the variable phase shifter 36, the output terminal of the variable phase shifter 36 may be connected to the input terminal of the variable attenuator 35. In addition, although the output terminal of the directional coupler 31 is connected to the input terminal of the directional coupler 32, the order of the directional couplers 31 and 32 may be reversed.

FIG. 4 shows a modification of the embodiment shown in FIG. 3. As shown in FIG. 4, the variable attenuator 7 and the variable phase shifter 8 in the main amplifier path 3 may be connected in the delay-line path 4, and the variable attenuator 10 and the variable phase shifter 11 in the auxiliary amplifier path 6 may be connected in the delay-line path 5. In this case, although both the variable attenuator 7 and the variable phase shifter 8 are connected in the delay-line path 4, only one of the variable attenuator 7 and the variable phase shifter 8 may be connected in the delay-line path 4. Similarly, although both the variable attenuator 10 and the variable phase shifter 11 are connected in the delay-line path 5, only one of the variable attenuator 10 and the variable phase shifter 11 may be connected in the delay-line path 5.

FIG. 5 shows the fourth embodiment of the present invention. In the fourth embodiment, homodyne detection circuits are used in place of the selection level gauges 38, 39, and 40 shown in FIG. 3. The same reference numerals as in FIG. 4 denote the same parts in FIG. 5, and a description thereof will be omitted. A homodyne detection circuit 51 is constituted by an amplifier 42, a low-pass filter 45, and a mixer 48. The homodyne detection circuit 51 performs homodyne detection using a local signal from an oscillator 21, thereby detecting with a high sensitivity a first pilot signal included in an output signal from a directional coupler 28 and oscillated by the oscillator 21. A homodyne detection circuit 52 comprises an amplifier 43, a low-pass filter 46, and a mixer 49. The homodyne detection circuit 52 performs homodyne detection using a local signal from an oscillator 22, thereby detecting with a high sensitivity a second pilot signal included in an output signal from an output terminal 19 and oscillated by the oscillator 22. In addition, a homodyne detection circuit 53 is constituted by an amplifier 44, a low-pass filter 47, and a mixer 50. The homodyne detection circuit 53 performs homodyne detection using a local signal from the oscillator 21, thereby detecting with a high sensitivity a first pilot signal included in the output signal from the output terminal 19 and oscillated by the oscillator 21.

The control circuit 41 controls a variable attenuator 7 and a variable phase shifter 8 such that the output level of the homodyne detection circuit 51 becomes minimum, and a phase difference detected by a phase difference detection circuit 33 is set to be 180°, or first pilot signals synthesized by a power synthesizer 15 on the basis of this detected phase difference respectively have opposite phases. The transfer characteristics of the two paths constituting a distortion detection circuit 1 are kept in a balanced state such that the two paths are equal to each other in amplitude and respectively have opposite phases. Similarly, a control circuit 41 controls a variable attenuator 10 and a variable phase shifter 11 such that the output level of the homodyne detection circuit 52 becomes minimum, and a phase difference detected by a phase difference detection circuit 34 is set to be 180°, or second pilot signals synthesized by a power synthesizer 16 on the basis of this detected phase difference respectively have opposite phases. The transfer characteristics of the two paths of a distortion removal circuit 2 are kept in a balanced state such that the two paths are equal to each other in amplitude and respectively have opposite phases. In addition, the control circuit 41 controls a variable attenuator 35 and a variable phase shifter 36 such that the output level of the homodyne detection circuit 53 becomes minimum. As a result, the first pilot signal injected from a directional coupler 24 and the first pilot signal input from the power synthesizer 23 become equal to each other in amplitude and respectively have opposite phases in the power synthesizer 16 to remove the first pilot signals, so that no first pilot signal is output from the output terminal 19. In this case, although all the selection level gauges 38, 39, and 40 are replaced with homodyne detection circuits 51, 52, and 53, respectively, only arbitrary one or two of the three selection level gauges may be replaced with homodyne detection circuits.

Figure 6:
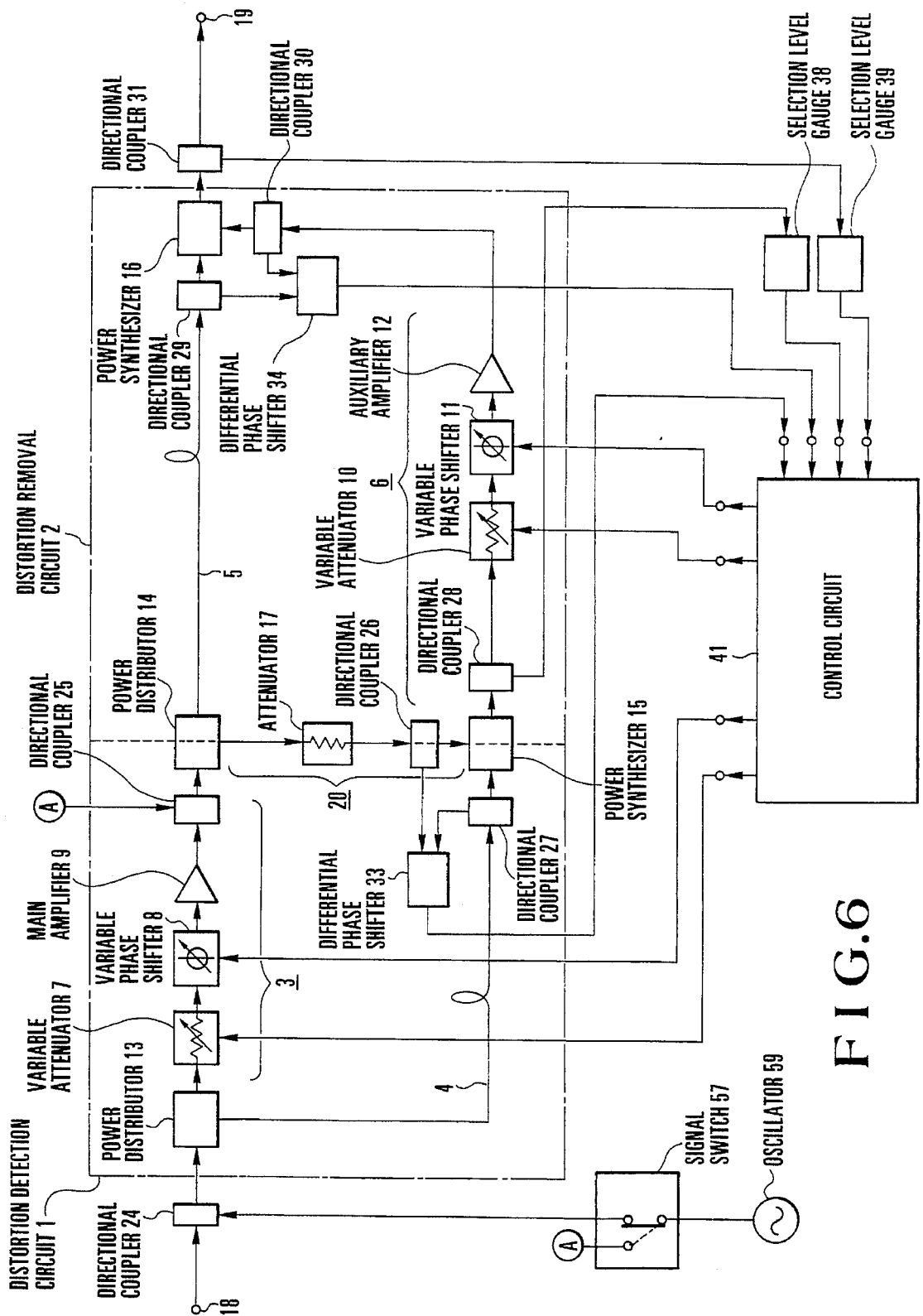
FIG. 6 is a block diagram showing a feedforward distortion compensation circuit according to the fifth embodiment of the present invention.

FIG. 6 shows the fifth embodiment of the present invention. The fifth embodiment is designed such that the first and second pilot signals in the embodiment of FIG. 1 are generated by a common oscillation source. The same reference numerals as in FIG. 1 denote the same parts in FIG. 6. Referring to FIG. 6, a signal switch 57 switches a pilot signal output from an oscillator 59 and having a predetermined frequency to one of directional couplers 24 and 25 under the control of a control circuit 41. The signal from the oscillator 59 switched by the signal switch 57 is output to the directional coupler 24 as the first pilot signal or to the directional coupler 25 as the second pilot signal. The control circuit 41 does not simultaneously perform a control operation of a variable attenuator 7 and a variable phase shifter 8 and a control operation of a variable attenuator 10 and a variable phase shifter 11, but the control circuit 41 alternately performs the control operations while being interlocked with the periodical switching operation of the signal switch 57. Note that, since the first and second pilot signals having the same frequency are not simultaneously injected into a distortion detection circuit 1, the first and second pilot signals are not erroneously detected. According to this embodiment, the number of oscillators for oscillating pilot signals can be advantageously decreased.

Figure 7:
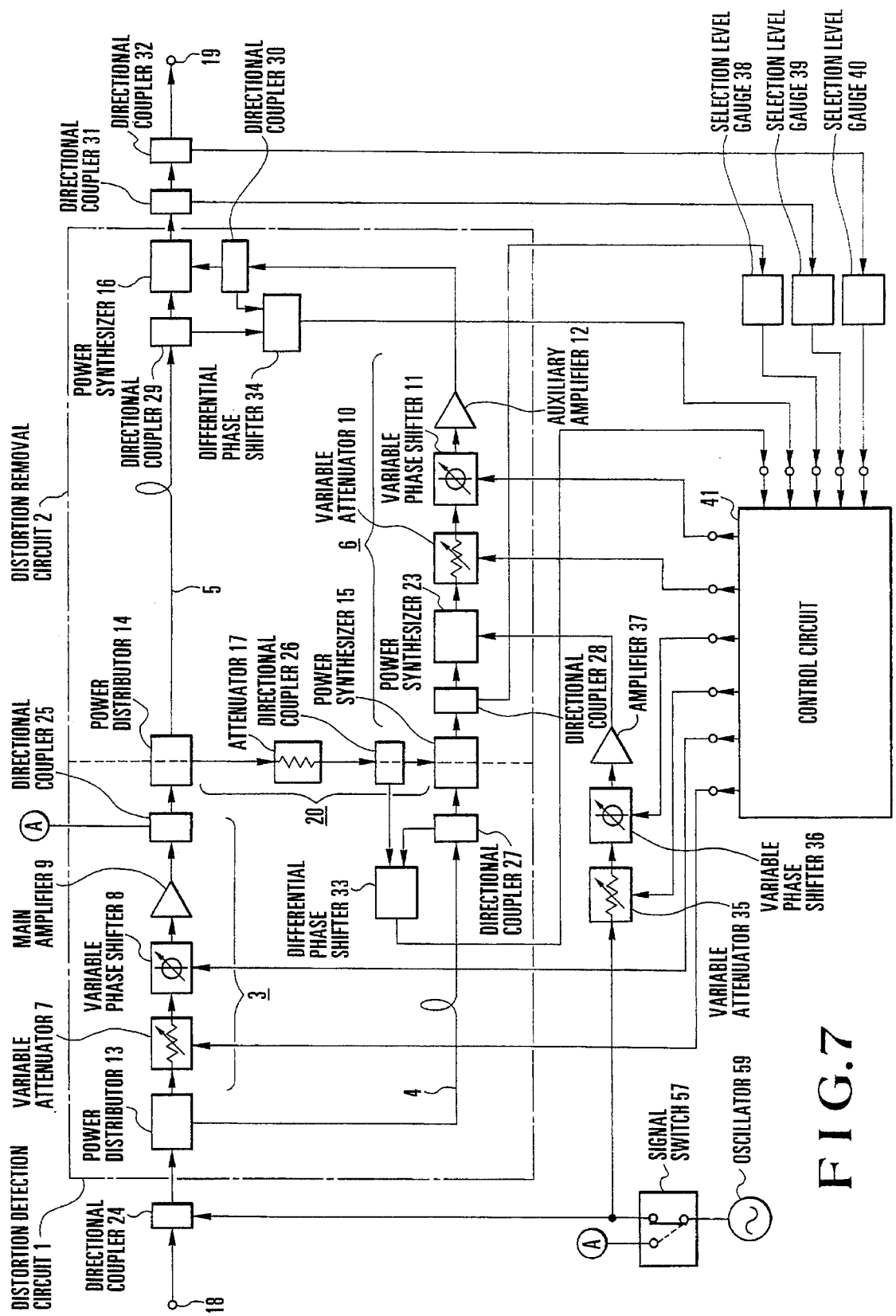
FIG. 7 is a circuit diagram showing a feedforward distortion compensation circuit according to the sixth embodiment of the present invention.

FIG. 7 shows the sixth embodiment of the present invention. This embodiment is designed such that the first and second pilot signals described in the embodiment of FIG. 3 are generated by a common oscillation source as in the embodiment of FIG. 6. The same reference numerals as in FIG. 3 denote the same parts in FIG. 7. Referring to FIG. 7, a signal switch 57 switches a pilot signal oscillated by an oscillator 59 and having a predetermined frequency to a directional coupler 24, a variable attenuator 35, or a directional coupler 25 under the control of a control circuit 41. The signal from the oscillator 59 switched by the signal switch 57 is output to the directional coupler 24 or the variable attenuator 35 as a first pilot signal or output to a directional coupler 25 as a second pilot signal. At this time, since the first and second pilot signals having the same frequency are not simultaneously injected into a distortion detection circuit 1, the first and second pilot signals are not erroneously detected. According to this embodiment, the number of oscillators for oscillating pilot signals can be advantageously decreased.

Figure 8:
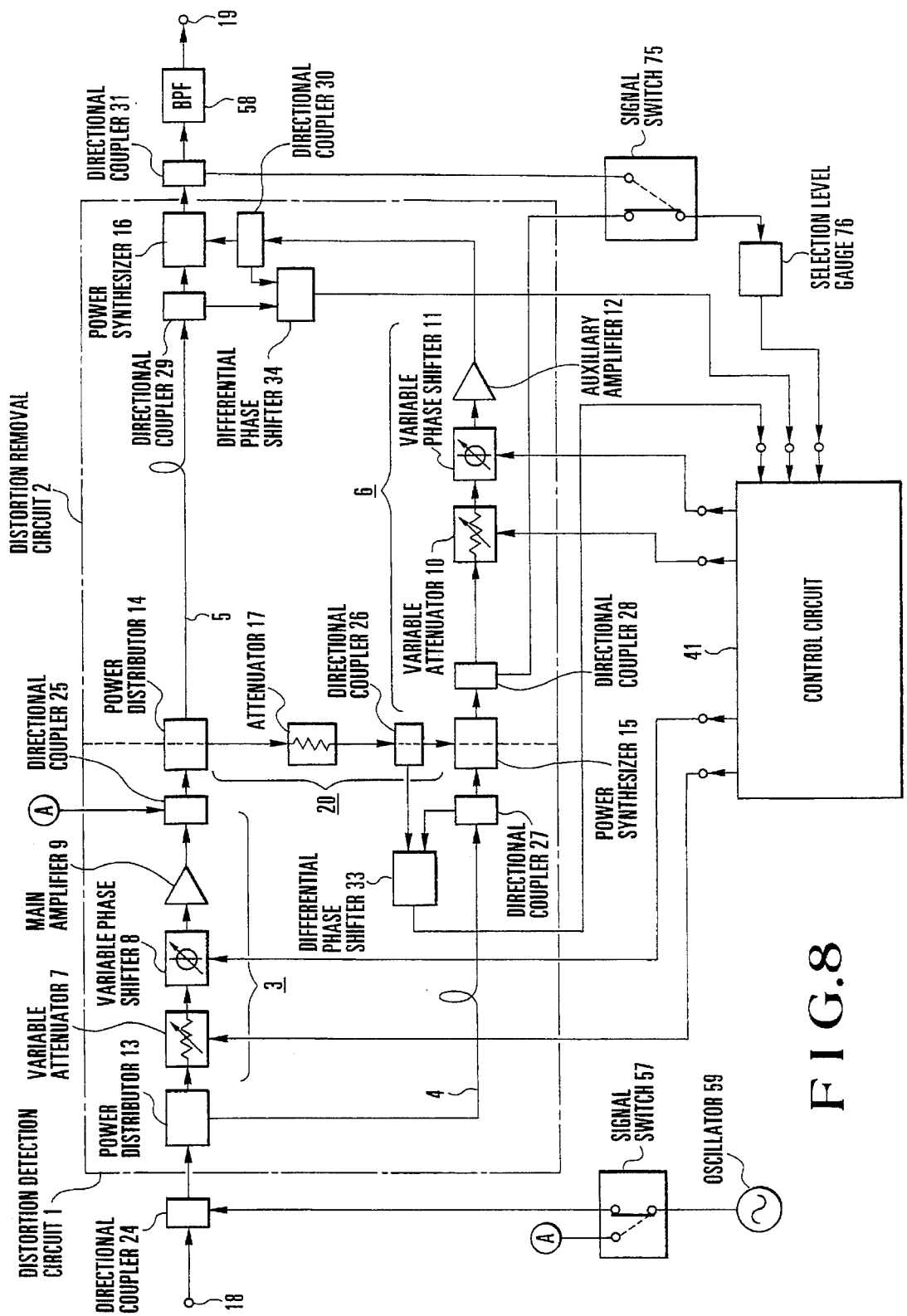
FIG. 8 is a block diagram showing a feedforward distortion compensation circuit according to the seventh embodiment of the present invention.

FIG. 8 shows the seventh embodiment of the present invention, and a common level detector is used in place of the selection level gauges 38 and 39. The same reference numerals as in FIG. 6 denote the same parts in FIG. 8. Referring to FIG. 8, a selection level gauge 76 selectively detects the signal levels of first and second pilot signals, and a signal switch 75 uses outputs from directional couplers 28 and 31 as inputs and selects outputs from the directional couplers 28 and 31 under the control of a control circuit 41 to output the selected output to the selection level gauge 76. The selection level gauge 76 selectively detects the level of the first pilot signal extracted from the output from the directional coupler 28 and the level of the second pilot signal extracted from the output from the directional coupler 31 to output the detection result to the control circuit 41. According to this embodiment, in addition to the effect of the embodiment in FIG. 6, the number of selection level gauges can be advantageously decreased.

Figure 9:
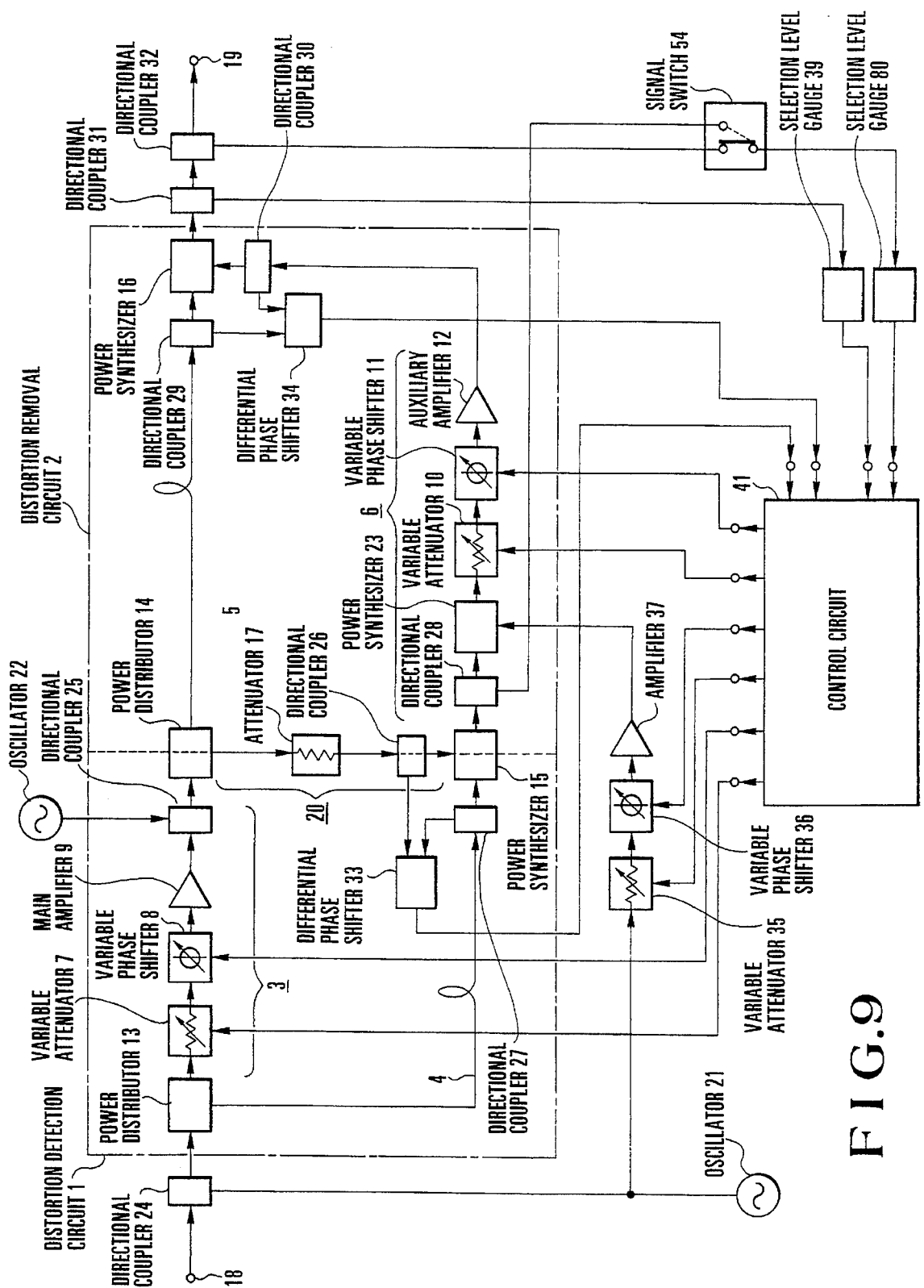
FIG. 9 is a block diagram showing a feedforward distortion compensation circuit according to the eighth embodiment of the present invention.

FIG. 9 shows the eighth embodiment of the present invention. In this embodiment, a common level gauge is used in place of the selection level gauges 38 and 40 shown in FIG. 3. The same reference numerals as in FIG. 3 denote the same parts in FIG. 9. Referring to FIG. 9, a selection level gauge 80 selectively detects the level of a first pilot signal extracted from an auxiliary amplifier path 6 and the level of a first pilot signal extracted from an output from an output terminal 19, and a signal switch 54 uses outputs from directional couplers 28 and 32 as inputs and selects the outputs from the directional couplers 28 and 32 under the control of a control circuit 41 to output the selected output to the selection level gauge 80. The selection level gauge 80 selectively detects the level of a first pilot signal extracted from the directional coupler 28 and the level of a first pilot signal extracted from the output from the directional coupler 32 to output the detection result to the control circuit 41. On the other hand, the level of a second pilot signal extracted from an output from a directional coupler 31 is detected by only a selection level gauge 39.

Figure 10:
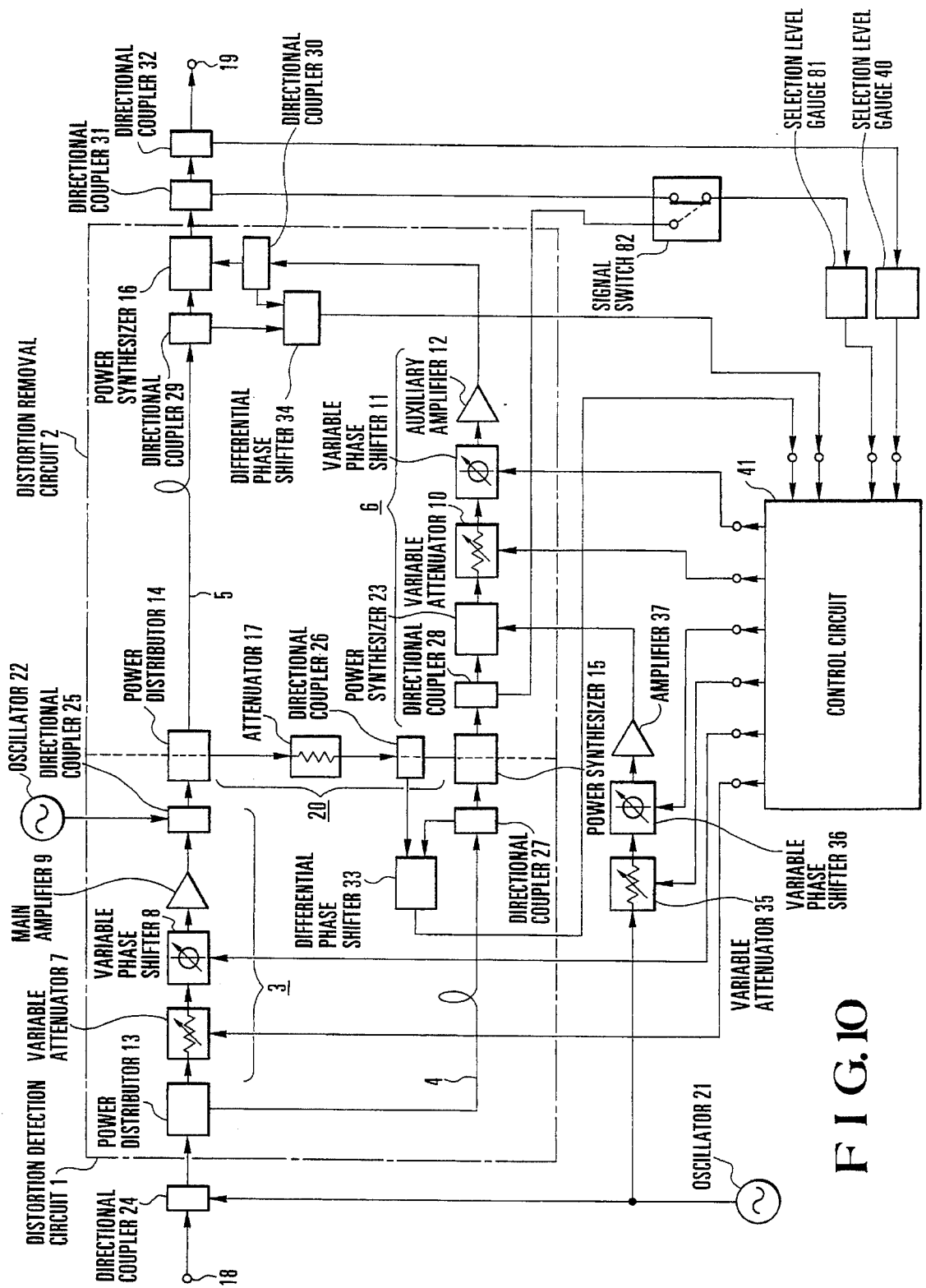
FIG. 10 is a circuit diagram showing a feedforward distortion compensation circuit according to the ninth embodiment of the present invention.

FIG. 10 shows the ninth embodiment of the present invention. In this embodiment, a common level detector is used in place of the selection level gauges 38 and 39 shown in FIG. 3. The same reference numerals as in FIG. 3 denote the same parts as in FIG. 10. Referring to FIG. 10, a selection level gauge 81 selectively detects the level of a first pilot signal extracted from an auxiliary amplifier path 6 and the level of a second pilot signal extracted from an output signal from an output terminal 19, and a signal switch 82 uses outputs from directional couplers 28 and 31 as inputs and selects the outputs from the directional couplers 28 and 31 under the control of a control circuit 41 to output the selected output to the selection level gauge 81. The selection level gauge 81 selectively detects the level of a first pilot signal extracted from the output from the directional coupler 28 and the level of the second pilot signal extracted from the directional coupler 31 to output the detection result to the control circuit 41. On the other hand, the level of a first pilot signal extracted from an output from a directional coupler 32 is detected by only a selection level gauge 40.

FIG. 11 shows 10th embodiment of the present invention. In this embodiment, a common level detector is used in place of the selection level gauges 38 and 39 shown in FIG. 7 as in the embodiment of FIG. 10. The same reference numerals as in FIG. 7 denote the same parts in FIG. 11. Referring to FIG. 11, a control circuit 41 controls a signal switch 82 while being interlocked with a signal switch 57. That is, the control circuit 41 selects an output from a directional coupler 28 when injection of a first pilot signal is selected by the signal switch 57, and the control circuit 41 selects an output from a directional coupler 31 when injection of a second pilot signal is selected by the signal switch 57. A selection level gauge 81 selectively detects the level of a first pilot signal extracted from the output from the directional coupler 28 and the level of a second pilot signal extracted from the output from the directional coupler 31 to output each detection result to the control circuit 41.

FIG. 12 shows the 11th embodiment of the present invention. In this embodiment, a common level detector is used in place of the selection level gauges 39 and 40 shown in FIG. 3. The same reference numerals as in FIG. 3 denote the same parts in FIG. 12. Referring to FIG. 12, a selection level gauge 83 selectively detects the levels of first and second pilot signals extracted from an output signal from an output terminal 19. A signal switch 84 which uses outputs from directional couplers 31 and 32 as inputs selects the outputs from the directional couplers 32 and 31 to output the selected output to the selection level gauge 83.

FIG. 13 shows the 12th embodiment of the present invention. In this embodiment, as shown in FIG. 12, a common level detector is used in place of the selection level gauges 39 and 40 shown in FIG. 7. The same reference numerals as in FIG. 7 denote the same parts in FIG. 13. Referring to FIG. 13, a control circuit 41 controls a signal switch 84 while being interlocked with a signal switch 57. That is, the control circuit 41 selects an output from a directional coupler 32 when injection of a first pilot signal is selected by the signal switch 57, and the control circuit 41 selects an output from a directional coupler 31 when injection of a second pilot signal is selected by the signal switch 57. A selection level gauge 83 selectively detects the level of a first pilot signal extracted from the output from the directional coupler 32 and the level of a second pilot signal extracted from the output from the directional coupler 31 to output each detection result to the control circuit 41.

Figure 14:
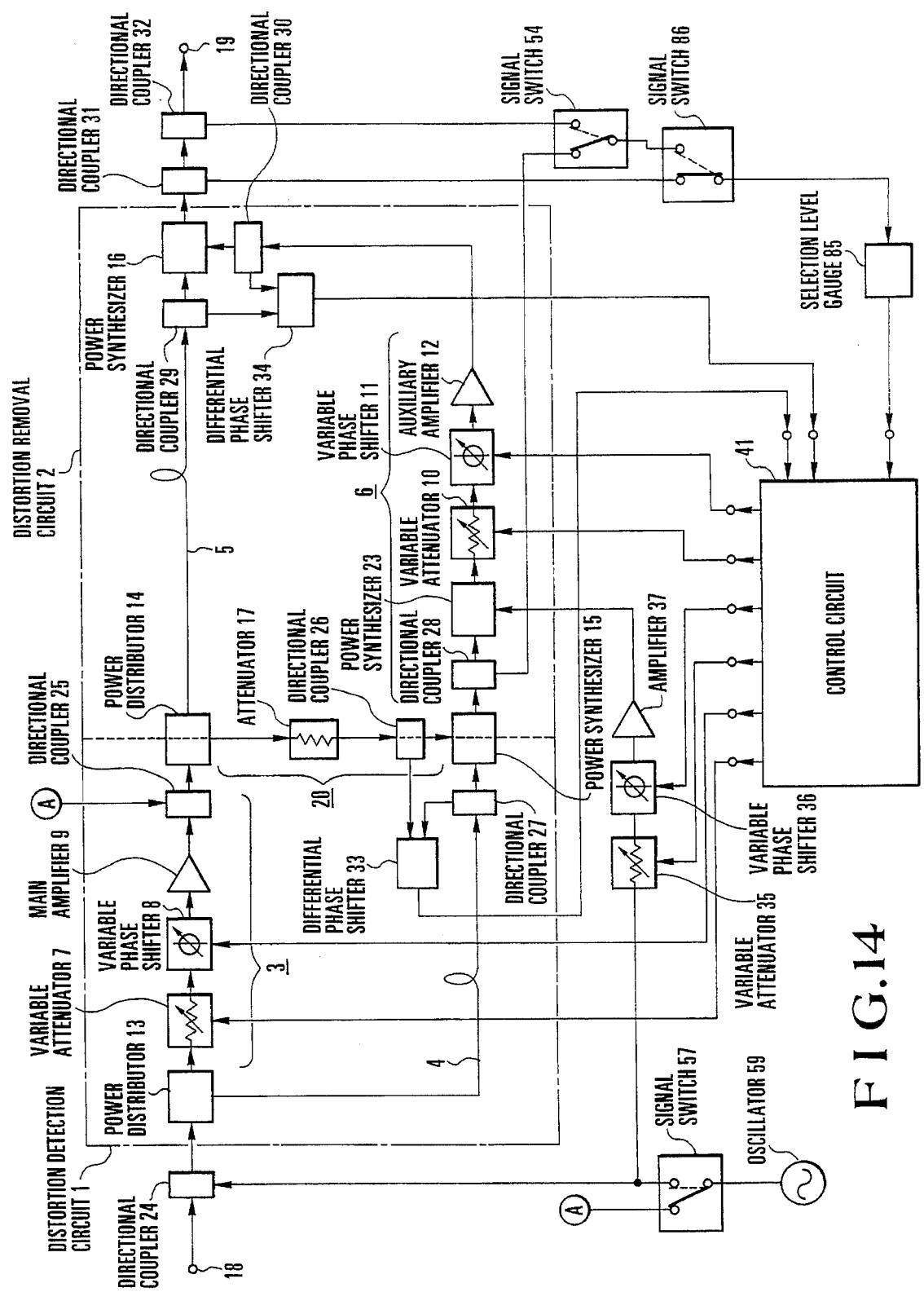
FIG. 14 is a block diagram showing a feedforward distortion compensation circuit according to the 13th embodiment of the present invention.

FIG. 14 shows the 13th embodiment of the present invention. In this embodiment, a common level detector is used in place of the selection level gauges 38, 39, and 40 shown in FIG. 7. The same reference numerals as in FIG. 7 denote the same parts in FIG. 14. Referring to FIG. 14, a signal switch 54 selects outputs from directional couplers 28 and 32, and a signal switch 86 selects outputs from the signal switch 54 and the directional coupler 28 to output the selected output to a selection level gauge 85. A control circuit 41 controls a signal switch 86 while being interlocked with a signal switch 57. That is, the control circuit 41 selects the level detection of a first pilot signal when injection of the first pilot signal is selected, and the control circuit 41 selects the level detection of a second pilot signal when injection of the second pilot signal is selected. When the first pilot signal is selected, the control circuit 41 controls the signal switch 54 to select an input destination. The selection level gauge 85 selectively detects the levels of first pilot signals extracted from the outputs from the directional couplers 28 and 32 and the level of a second pilot signal extracted from an output from a directional coupler 31 to output the detection result to the control circuit 41.

Figure 15:
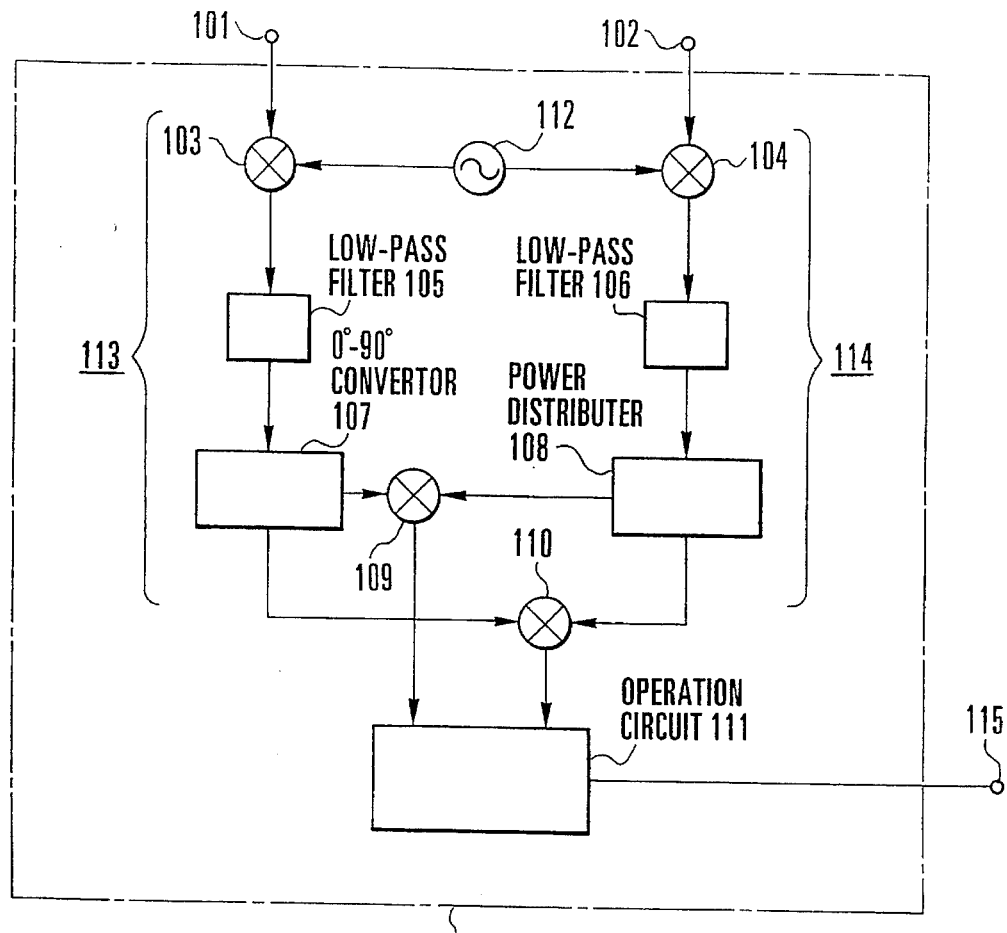
FIG. 15 is a block diagram showing a phase difference detection circuit used in the present invention.
Figure 17:
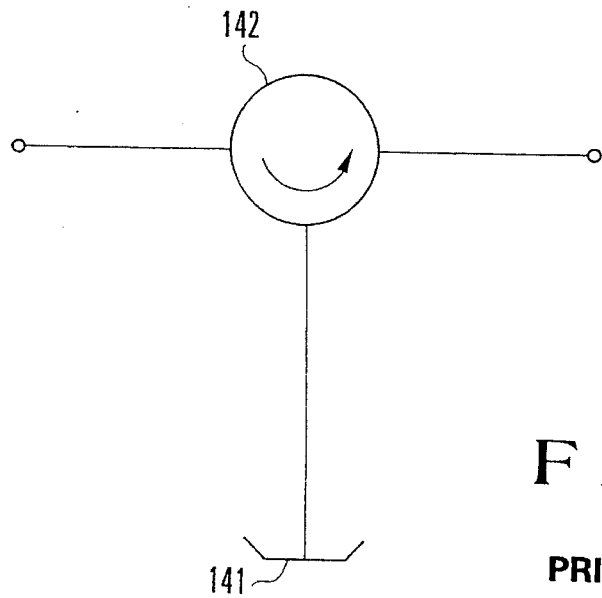
FIG. 17 is a view for explaining a phase inversion circuit using a circulator and used in FIG. 16.

FIG. 15 shows a phase difference detection circuit 33 serving as a phase difference detection circuit used in the present invention.

The phase difference detection circuit 33 comprises an input signal path 113 constituted by connecting an input signal terminal 101, a mixer 103, a low-pass filter 105, and a 0°–90° converter 107 in series with each other, an input signal path 114 constituted by connecting an input signal terminal 102, a mixer 104, a low-path filter 106, and a power distributer 108 in series with each other, an oscillator 112 for inputting a local signal having a frequency equal to that of an input signal input from the input signal terminals 101 and 102 to the mixers 103 and 104, a mixer 109 using, as inputs, one of two output signals from the 0°–90° converter 107 and one of two output signals from the power distributer 108, a mixer 110 using, as inputs, the other of the two output signals from the 0° 90° converter 107 and the other of the two output signals from the power distributer 108, which selected output signals are different from the output signals input to the mixer 109, an operation circuit 111 using, as inputs, output signals from the mixer 109 and the mixer 110, and an output terminal 115.

Input signals supplied from the input signal terminals 101 and 102 are detected by a local signal from the oscillator 112, the signal supplied from the input signal terminal 101 is input to the 0°–90° converter 107, and the signal supplied from the input signal terminal 102 is input to the power distributer 108. One of two outputs from the 0°–90° converter 107 is input to the mixer 109, and the other is input to the mixer 110. One of two outputs from the power distributer 108 is input to the mixer 109, and the other is input to the mixer 110. The outputs from the mixers 109 and 110 are input to the operation circuit 111. The operation circuit 111 calculates the inverse trigometric function of the two input signals to output the calculation result to the output terminal 115.

Since the inverse trigonometric function can be calculated in the control circuit 41 of the feedforward distortion compensation circuit, the phase difference detection circuit may not comprise the operation circuit 111.

As described above, in the feedforward distortion compensation circuit according to the present invention, phase difference detection circuits are respectively arranged in the distortion detection circuit and the distortion removal circuit. In addition, when a level detection circuit is arranged on the output side of each circuit, the phase difference between pilot signals flowing in the circuits and the residual levels of the pilot signals are detected. The detected phase difference represents the transfer characteristics of the distortion detecting circuit and the distortion removal circuit. For this reason, when a phase shifter of each circuit is adjusted on the basis of the phase difference, the conditions for opposite phases required when each circuit synthesizes signals with each other can be faithfully realized. In addition, when the control circuit has a learning function or the like, the phase difference directly represents an accurate phase shift amount of the variable phase shifter, the variable phase shifter can be adjusted by a single step. The detected residual level represents the incomplete adjustment of each circuit. For this reason, when the variable attenuator and variable phase shifter of each circuit are adjusted on the basis of the residual level, an equal amplitude condition required when signals are synthesized with each other can be realized. In particular, after the variable phase shifter is adjusted on the basis of the phase difference, the adjustment using the residual level is effective.

As has been described above, the level of a residual pilot signal generated by the incomplete signal canceling condition between the distortion detection circuit and the distortion removal circuit is detected by first to third level detection means, and the phase difference between two pilot signals immediately before synthesis in the final stages of the distortion detection circuit and the distortion removal circuit are detected by first and second phase shift detecting means. A first electrical variable attenuation means, a first electrical variable phase shifting means, a second electrical variable attenuation means, and a second electrical variable phase shifting means are automatically adjusted to keep the transfer characteristics of the circuits optimum such that, on the basis of the detected data, a detection level becomes minimum, a detected phase difference is set to be 180°, or pilot signals to be synthesized with each other in each path respectively have opposite phases. For this reason, the adjustment amount of the variable phase shifter can be directly calculated, and the number of steps required for control can be decreased. At the same time, a change in transfer characteristics from a small change in transfer characteristics of the circuits caused by an environmental change or the like to an abrupt change in transfer characteristics can be detected and compensated for. Therefore, a stable balanced state can be advantageously kept.

What is claimed is:

1. A feedforward distortion compensation circuit comprising:

a main amplification path including main amplifying means for amplifying a signal, first variable attenuating means for adjusting an attenuation amount, and first variable phase shifting means for adjusting a phase shift amount;

an auxiliary amplification path including auxiliary amplifying means for amplifying a signal, second variable attenuating means for adjusting an attenuation amount, and second variable phase shifting means for adjusting a phase shift amount;

first and second transmission paths for transmitting signals;

a signal attenuation path for attenuating a signal by predetermined attenuation;

first signal injecting means for injecting a first pilot signal having a specific frequency into an input signal from an input terminal;

first signal distributing means for distributing the input signal, into which the first pilot signal is injected, to said main amplification path and said first transmission path;

second signal injecting means for injecting a second pilot signal having a specific frequency into said main amplification path;

second signal distributing means for distributing an output signal from said main amplification path to said second transmission path and said signal attenuation path;

first signal synthesizing means for synthesizing an output signal from said first transmission path with an output signal from said signal attenuation path to output a synthesized signal to said auxiliary amplification path;

first phase difference detecting means for detecting a phase difference between the first pilot signal passing through said main amplification path and the first pilot signal passing through said first transmission path;

first level detecting means for detecting a level of the first pilot signal passing through said auxiliary amplification path;

second phase difference detecting means for detecting a phase difference between the second pilot signal passing through said auxiliary amplification path and the second pilot signal passing through said second transmission path;

second signal synthesizing means for synthesizing an output signal from said auxiliary amplification path with an output signal from said second transmission path to output a synthesized signal to an output terminal;

second level detecting means for detecting a level of the second pilot signal included in an output signal from said second signal synthesizing means; and control means for controlling said first variable attenuating means and said first variable phase shifting means such that a detection level of said first level detecting means becomes minimum, and the first pilot signals synthesized by said first signal synthesizing means on the basis of the phase difference detected by the first phase difference detecting means respectively have opposite phases, and controlling said second variable attenuating means and said second variable phase shifting means such that a detection level of said second level detecting means becomes minimum, and the second pilot signals synthesized by said second signal synthesizing means on the basis of the phase difference detected by said second phase difference detecting means respectively have opposite phases.

2. A circuit according to claim 1, wherein said first signal injecting means comprises first oscillating means for oscillating the first pilot signal having the specific frequency, said second signal injecting means comprises second oscillating means for oscillating the second pilot signal having the specific frequency different from that of the first pilot signal, and said control means simultaneously performs control of said first variable attenuating means and said first variable phase shifting means with respect to the first pilot signal and control of said second variable attenuating means and said second variable phase shifting means with respect to the second pilot signal.

3. A circuit according to claim 1, further comprising a signal removing means for removing a residual first pilot signal from the output signal from said second signal synthesizing means.

4. A circuit according to claim 3, wherein said signal removing means is constituted by a band-pass filter, connected between said second signal synthesizing means and said output terminal, for causing only a signal component of the output signal from said second signal synthesizing means to pass.

5. A circuit according to claim 3, wherein said signal removing means comprises third signal injecting means constituted by third signal injecting means for injecting the first pilot signal into said auxiliary amplifying path, third variable attenuating means for adjusting an attenuation amount of the first pilot signal injected into said auxiliary amplifying path, third variable phase shifting means for adjusting a phase shift amount of the first pilot signal, and amplifying means for amplifying the first pilot signal and third level detecting means for detecting a level of a first pilot signal included in the output signal from said second signal synthesizing means, and said control means controls said third variable attenuating means and said third variable phase shifting means such that the level of the first pilot signal detected by said third level detecting means becomes minimum.

6. A circuit according to claim 5, wherein said first and second signal injecting means comprise oscillating means for oscillating one signal having a specific frequency and first switching means for outputting the signal having the specific frequency by switching between the first pilot signal respectively injected into an input signal from said input terminal and said auxiliary amplification path and the second pilot signal injected into said main amplification path, and said control means selectively performs control of said first variable attenuating means and said first variable phase shifting means and control of said third variable attenuating means and said third variable phase shifting means with respect to the first pilot signal, and control of said second variable attenuating means and said second variable phase shifting means with respect to the second pilot signal while being interlocked with first said switching means.

7. A circuit according to claim 6, further comprising second switching means for selecting a level detection operation, wherein said first level detecting means is constituted by a level detector for selectively detecting the level of a pilot signal in combination with said second switching means when said second switching means has selected a level detecting operation of said first pilot signal extracted from said auxiliary amplification path, and wherein said second level detecting means comprises said level detector for selectively detecting a level of a pilot signal in combination with said second switching means when said second switching means has selected a level detecting operation of said second pilot signal extracted from the output signal from said second signal synthesizing means in said level detector, and wherein said control means performs a switching control operation of said second switching means while being interlocked with said first switching means such that the level detection of the first pilot signal from said auxiliary amplification path is selected when injection of the first pilot signal is selected by said first switching means and the level detection of the second pilot signal extracted from the output signal from said second signal synthesizing means is selected when injection of the second pilot signal is selected by said first switching means.

8. A circuit according to claim 6, further comprising second switching means for alternately switching level detection operations of the first and second pilot signals respectively extracted from the output signals from said second signal synthesizing means, wherein said second level detecting means is constituted by a level detector for selectively detecting the level of a pilot signal in combination with second switching means when said level detecting operation of said first pilot signal has been selected, and wherein said third level detecting means is constituted by said level detector in combination with said second switching means when said level detecting operation of said second pilot signal has been selected, and said control means performs a switching control operation of said second switching means while being interlocked with said first switching means such that level detection of the first pilot signal extracted from the output signal from said second signal synthesizing means is selected when injection of the first pilot signal is selected by said first switching means and level detection of the second pilot signal extracted from the output signal from said second signal synthesizing means is selected when injection of the second pilot signal is selected by said first switching means.

9. A circuit according to claim 5, further comprising switching means for selecting a level detection operation, wherein said first level detecting means is constituted by a level detector for selectively detecting the level of a pilot signal in combination with said switching means when said switching means has selected a level detecting operation of said first pilot signal extracted from said auxiliary amplification path, and wherein said third level detecting means comprises said level detector for selectively detecting a level of a pilot signal in combination with said switching means when said switching means has selected a level detecting operation of said first pilot signal extracted from the output signal from said second signal synthesizing means in said level detector.

10. A circuit according to claim 5, further comprising switching means for alternately selecting the level detection operations of said first pilot signal or said second pilot signal in a level detector, wherein said first level detecting means is constituted by a level detector for selectively performing level detection of a pilot signal in combination with said switching means when the level detecting operation of said first pilot signal has been selected, and wherein said second level detecting means is constituted by said level detector in combination with said switching means when the level detecting operation of said second pilot signal has been detected.

11. A circuit according to claim 5, further comprising switching means for alternately selecting level detection operations of the first pilot signal or the second pilot signal respectively extracted from the output signals from said second signal synthesizing means, wherein said second level detecting means is constituted by a level detector for selectively detecting the level of a pilot signal in combination with said switching means when said level detecting operation of said first pilot signal has been selected, and wherein said third level detecting means is constituted by said level detector in combination with said switching means when said level detecting operation of said second pilot signal has been selected.

12. A circuit according to claim 5, further comprising:

first switching means for selecting one of said first pilot signal extracted from said auxiliary amplification path and said first pilot signal extracted from the output signal from said second signal synthesizing means; and second switching means for selecting as level detecting operation of said second pilot signal extracted from the output signal from said second signal synthesizing means and a level detecting operation of said first pilot signal selected by said first switching means;

wherein said first level detecting means is constituted by a level detector for selectively detecting the level of a pilot signal in combination with first switching means and in combination with second switching means, when said first switching means has selected a level detecting operation of said first pilot signal extracted from said auxiliary amplification path and when said second switching means has selected a level detecting operation of said first pilot signal selected by said first switching means;

and wherein said second level detecting means is constituted by said level detector in combination with said first switching means and in combination with said second switching means, when said second switching means has selected a level detecting operation of said second pilot signal extracted from the output signal from said second signal synthesizing means;

and wherein said third level detecting means is constituted by said level detector in combination with said first switching means and in combination with said second switching means, when said first switching means has selected a level detecting operation of said first pilot signal extracted from the output signal from said second signal synthesizing means and when said second switching means has selected a level detecting operation of said first pilot signal selected by said first switching means;

and wherein said control means performs switching control operations of said first and second switching means while being interlocked with a switching operation of third switching means such that the level detection of the first pilot signal extracted from said auxiliary amplification path and the level detection of the first pilot signal extracted from the output signal from said second signal synthesizing means are selected when injection of the first pilot signal is selected by said third switching means, and the level detection of the second pilot signal extracted from the output signal from said second signal synthesizing means is selected when injection of the second pilot signal is selected by said third switching means.

13. A circuit according to claim 1, wherein said first and second level detecting means are constituted by homodyne detection circuits for performing homodyne detection on the basis of local signals respectively having frequencies equal to those of the first and second pilot signals to detect the first and second pilot signals with a high sensitivity.

14. A circuit according to claim 1, wherein said first and second signal injecting means comprise oscillating means for oscillating one signal having a specific frequency and switching means for outputting the signal having the specific frequency by switching between the first pilot signal injected into an input signal from said input terminal and the second pilot signal injected into said main amplification path, and said control means selectively performs control of said first variable attenuating means and said first variable phase shifting means with respect to the first pilot signal and control of said second variable attenuating means and said second variable phase shifting means with respect to the second pilot signal while being interlocked with said switching means.

15. A circuit according to claim 1, further comprising switching means for selecting a level detection operation, wherein said first level detecting means comprises a level detector for selectively detecting a level of a pilot signal in combination with said switching means when said switching means has selected a level detecting operation of said first pilot signal extracted from said auxiliary amplification path, and wherein said second level detecting means comprises said level detector for selectively detecting a level of a pilot signal in combination with said switching means when said switching means has selected a level detecting operation of said second pilot signal extracted from the output signal from said second signal synthesizing means.

16. A circuit according to claim 1, wherein the specific frequency of said first pilot signal is different from that of said second pilot signal.

17. A circuit according to claim 1, wherein the specific frequency of said first pilot signal is identical with that of said second pilot signal.

18. A feedforward distortion compensation circuit comprising:

a main amplification path including main amplifying means for amplifying a signal, first variable attenuating means for adjusting an attenuation amount, and first variable phase shifting means for adjusting a phase shift amount;

an auxiliary amplification path including auxiliary amplifying means for amplifying a signal, second variable attenuating means for adjusting an attenuation amount, and second variable phase shifting means for adjusting a phase shift amount;

first and second transmission paths for transmitting signals;

a signal attenuation path for attenuating a signal by predetermined attenuation;

first signal injecting means for injecting a first pilot signal having a specific frequency into an input signal from an input terminal;

first signal distributing means for distributing the input signal, into which the first pilot signal is injected, to said main amplification path and said first transmission path;

second signal injecting means for injecting a second pilot signal, having a specific frequency different from that of the first pilot signal, into said main amplification path;

second signal distributing means for distributing an output signal from said main amplification path to said second transmission path and said signal attenuation path;

first signal synthesizing means for synthesizing an output signal from said first transmission path with an output signal from said signal attenuation path to output a synthesized signal to said auxiliary amplification path;

first phase difference detecting means for detecting a phase difference between the first pilot signal passing through said main amplification path and the first pilot signal passing through said first transmission path;

first level detecting means for detecting a level of the first pilot signal passing through said auxiliary amplification path;

second phase difference detecting means for detecting a phase difference between the second pilot signal passing through said auxiliary amplification path and the second pilot signal passing through said second transmission path;

second signal synthesizing means for synthesizing an output signal from said auxiliary amplification path with an output signal from said second transmission path to output a synthesized signal to an output terminal;

second level detecting means for detecting a level of the second pilot signal included in an output signal from said second signal synthesizing means; and control means for controlling said first variable attenuating means and said first variable phase shifting means such that a detection level of said first level detecting means becomes minimum, and the first pilot signals synthesized by said first signal synthesizing means on the basis of the phase difference detected by said first phase difference detecting means respectively have opposite phases, and, at the same time, controlling said second variable attenuating means and said second variable phase shifting means such that a detection level of said second level detecting means becomes minimum, and the second pilot signals synthesized by said second signal synthesizing means on the basis of the phase difference detected by said second phase difference detecting means respectively have opposite phases.

19. A feedforward distortion compensation circuit comprising:

a main amplification path including main amplifying means for amplifying a signal, first variable attenuating means for adjusting an attenuation amount, and first variable phase shifting means for adjusting a phase shift amount;

an auxiliary amplification path including auxiliary amplifying means for amplifying a signal, second variable attenuating means for adjusting an attenuation amount of an input signal, and second variable phase shifting means for adjusting a phase shift amount of the input signal;

first and second transmission paths for transmitting signals;

a signal attenuation path for attenuating a signal by predetermined attenuation;

switching means for outputting one signal having a specific frequency by switching between a first pilot signal and a second pilot signal;

first signal injecting means for injecting the first pilot signal into the input signal from an input terminal;

second signal injecting means for injecting the second pilot signal into said main amplification path;

first signal distributing means for distributing the input signal, into which the first pilot signal is injected, to said main amplification path and said first transmission path;

second signal distributing means for distributing an output signal from said main amplification path to said second transmission path and said signal attenuation path;

first signal synthesizing means for synthesizing an output signal from said first transmission path with an output signal from said signal attenuation path to output a synthesized signal to said auxiliary amplification path;

first phase difference detecting means for detecting a phase difference between the first pilot signal passing through said main amplification path and the first pilot signal passing through said first transmission path;

first level detecting means for detecting a level of the first pilot signal passing through said auxiliary amplification path;

second phase difference detecting means for detecting a phase difference between the second pilot signal passing through said auxiliary amplification path and the second pilot signal passing through said second transmission path;

second signal synthesizing means for synthesizing an output signal from said auxiliary amplification path with an output signal from said second transmission path to output a synthesized signal to an output terminal;

second level detecting means for detecting a level of the second pilot signal included in an output signal from said second signal synthesizing means; and control means for controlling said first variable attenuating means and said first variable phase shifting means such that, when the first pilot signal is injected by said switching means, a detection level of said first level detecting means becomes minimum, and the first pilot signals synthesized by said first signal synthesizing means on the basis of the phase difference detected by said first phase difference detecting means respectively have opposite phases, and controlling said second variable attenuating means and said second variable phase shifting means such that, when the second pilot signal is injected by said switching means, a detection level of said second level detecting means becomes minimum, and the second pilot signals synthesized by said second signal synthesizing means on the basis of the phase difference detected by said second phase difference detecting means respectively have opposite phases.

* * * * *

UNITED STATES PATENT AND TRADEMARK OFFICE
CERTIFICATE OF CORRECTION

PATENT NO. : 5,493,252
DATED : February 20, 1996
INVENTOR(S) : Ken-Ichi Takai

It is certified that error appears in the above-indentified patent and that said Letters Patent is hereby corrected as shown below:

Column 13, line 30, delete "0° 90°" and insert --0°-90°--.

Column 15, line 66, after "comprises" insert -- a signal injecting circuit constituted by --.

Signed and Sealed this

Sixth Day of August, 1996

Attest:

BRUCE LEHMAN

Attesting Officer

Commissioner of Patents and Trademarks